United States Patent
Sherman et al.

(10) Patent No.: US 8,887,453 B2
(45) Date of Patent: Nov. 18, 2014

(54) SUPPORTING STRUCTURES FOR BUILDING INTEGRABLE PHOTOVOLTAIC MODULES

(75) Inventors: Adam C. Sherman, Newark, CA (US); Michael Meyers, San Jose, CA (US)

(73) Assignee: Hanergy Holding Group Ltd, Beijing (CN)

( * ) Notice: Subject to any disclaimer, the term of this patent is extended or adjusted under 35 U.S.C. 154(b) by 225 days.

(21) Appl. No.: 13/108,749

(22) Filed: May 16, 2011

(65) Prior Publication Data
US 2012/0291848 A1    Nov. 22, 2012

(51) Int. Cl.
*E04D 13/18*    (2014.01)
*E04H 14/00*    (2006.01)
*H01L 31/048*   (2014.01)
*H01L 31/052*   (2014.01)

(52) U.S. Cl.
CPC ............. *H01L 31/0482* (2013.01); *Y02B 10/12* (2013.01); *Y02E 10/50* (2013.01); *H01L 31/052* (2013.01)
USPC ........................... 52/173.3; 136/244; 136/251

(58) Field of Classification Search
USPC ............. 52/173.3; 248/316, 309.1, 316.1; 136/243, 244, 251, 206
See application file for complete search history.

(56) References Cited

U.S. PATENT DOCUMENTS

| | | | | |
|---|---|---|---|---|
| 4,636,577 A | * | 1/1987 | Peterpaul | 136/206 |
| 5,409,549 A | * | 4/1995 | Mori | 136/244 |
| 5,706,617 A | * | 1/1998 | Hirai et al. | 52/173.3 |
| 6,065,255 A | * | 5/2000 | Stern et al. | 52/173.3 |
| 6,155,006 A | * | 12/2000 | Mimura et al. | 52/173.3 |
| 6,182,403 B1 | * | 2/2001 | Mimura et al. | 52/173.3 |
| 6,201,179 B1 | * | 3/2001 | Dalacu | 136/244 |
| 6,311,436 B1 | * | 11/2001 | Mimura et al. | 52/173.3 |
| 6,365,824 B1 | * | 4/2002 | Nakazima et al. | 136/251 |
| 6,435,629 B1 | * | 8/2002 | Egle et al. | 305/136 |
| 6,498,289 B1 | * | 12/2002 | Mori et al. | 136/244 |
| 6,809,251 B2 | * | 10/2004 | Dinwoodie | 136/251 |
| 6,883,290 B2 | * | 4/2005 | Dinwoodie | 52/748.1 |
| 7,178,295 B2 | * | 2/2007 | Dinwoodie | 52/173.3 |
| 7,328,534 B2 | * | 2/2008 | Dinwoodie | 52/173.3 |
| 8,186,111 B2 | * | 5/2012 | Flaherty et al. | 52/173.3 |
| 8,272,176 B2 | * | 9/2012 | Wallgren | 52/173.3 |
| 8,375,653 B2 | * | 2/2013 | Shiao et al. | 52/173.3 |
| 2006/0266405 A1 | * | 11/2006 | Lenox | 136/244 |
| 2011/0067327 A1 | * | 3/2011 | Eiffert et al. | 52/173.3 |
| 2012/0110931 A1 | * | 5/2012 | Eiffert et al. | 52/173.3 |

* cited by examiner

*Primary Examiner* — Chi Q Nguyen
(74) *Attorney, Agent, or Firm* — Weaver Austin Villeneuve & Sampson LLP

(57) ABSTRACT

Building integrable photovoltaic (BIP) modules include photovoltaic inserts for producing electrical power and supporting structures for mechanically attaching and supporting the insert with respect to a building structure, such as roof tops. The supporting structures may include ventilation ribs that form ventilation channels under the photovoltaic insert and, in certain embodiments, under other components of the module. These ribs may be used to provide mechanical support to the entire module. In specific embodiments, ventilation channels of one module are configured to coincide with ventilation channels of one or more other like modules and to form a continuous channel along the roof edge. The supporting structures may be used to form moisture barriers in between two modules, such as side glitters. In certain embodiments, supporting structures are separate components and are attached to the insert to form a module during fabrication or installation of the module on a building structure.

22 Claims, 13 Drawing Sheets

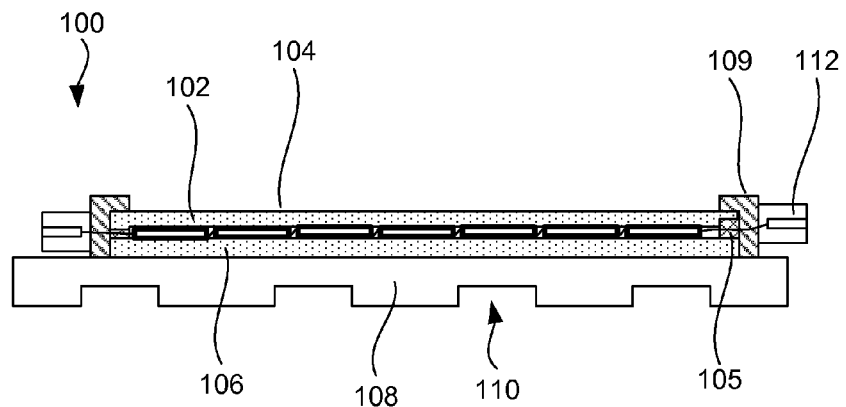
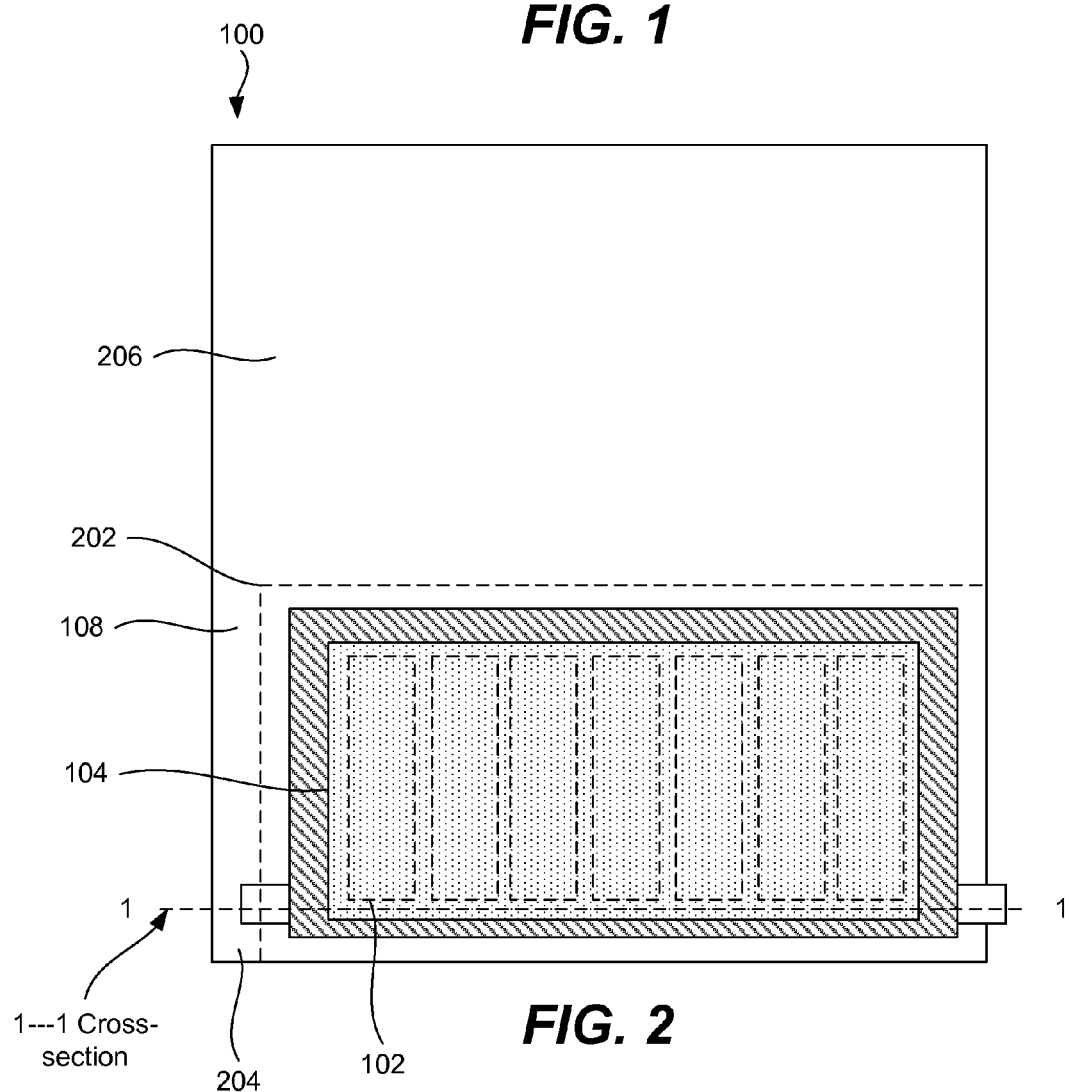

SUPPORTING STRUCTURES FOR BUILDING INTEGRABLE PHOTOVOLTAIC MODULES

BACKGROUND

Photovoltaic cells are widely used for electricity generation with one or more photovoltaic cells typically sealed within a module. Multiple modules are then arranged into photovoltaic arrays that are used to convert solar energy into electricity by the photovoltaic effect. Photovoltaic arrays can be installed on building rooftops, other building structures, or mounting structures and are used to provide electricity to the buildings and to the general electrical grid.

SUMMARY

Provided are novel building integrable photovoltaic (BIP) modules that include photovoltaic inserts for producing electrical power output and various supporting structures for mechanically attaching and supporting a photovoltaic insert with respect to a building structure, such as a roof top. The supporting structures may include ventilation ribs that form ventilation channels for providing an air flow under the photovoltaic insert and, in certain embodiments, under other components of the BIP module. In specific embodiments, ventilation channels of one module are configured to coincide with ventilation channels of one or more other like modules to form a continuous channel, for example along a roof edge. The supporting structures may be used to form moisture barriers between modules, such as side gutters. In certain embodiments, supporting structures are separate components and are attached to the insert to form a module during fabrication or installation of the module on a building structure.

In certain embodiments, a BIP module includes a photovoltaic insert and a base tray attached to the insert along at least one of its edges. The insert itself includes a support sheet and one or more photovoltaic cells positioned on that support sheet. The base tray includes a base sheet and two or more ventilation ribs extending from the base sheet. After assembly of the module, the ventilation ribs extend towards the support sheet of the insert. The ventilation ribs create one or more ventilation channels between the base sheet of the tray and the support sheet of the insert. In certain embodiments, the ventilation channels and the corresponding ventilation channels have a height of at least about 0.5 inches.

The base tray is configured for attachment to a building structure. Furthermore, the base tray is also configured to mechanically support the photovoltaic insert with respect to that building structure. The base tray may include a support flap, which is attached to the base sheet along one of its edges. The support flap is configured to extend under a portion of one or more adjacent modules in an upper row. If a module has a support flap, the photovoltaic insert may be also attached to the base tray along its interface between the base sheet and support flap.

In certain embodiments, a building integrable photovoltaic module includes one or more side channels. A side channel of one module is configured to interlock with a corresponding side channel of an adjacent module to form a side gutter after installation of the modules into an array. The side gutter may be configured to capture water leaking through a gap between these two modules and, in certain embodiments, to deliver this captured water over the top surface of another module in a lower row.

The base tray may be attached to the photovoltaic insert using various mechanical attachment techniques. For example, the base tray may he removably attached to the insert using a set of interlocking features disposed on one or multiple ventilation ribs. In the same or another embodiment, the base tray is glued to the insert during fabrication or installation of the module. The base tray may be made from various materials listed below.

Provided also is a BIP module that includes a plurality of separate components that are mechanically attached during fabrication or installation of the module. These components include a base portion having a support flap, a photovoltaic insert having one or more photovoltaic cells positioned on a support sheet, and a support unit. The support unit includes a cross-bar and two rib structures, i.e., a first rib structure and a second rib structure, attached to and extending away from the cross-bar. The first rib structure may extend in a direction substantially opposite to the second rib structure. The first rib structure is configured to support the base portion, while the second rib structure is configured to support the photovoltaic insert. In certain embodiments, the second rib structure is also configured to form ventilation channels between the insert and a building structure after installing the module onto the building structure.

Various mechanical attachment features may be used to attach the two rib structure to the base portion and photovoltaic insert. In certain embodiments, the first rib structure is attached to the base portion using an adhesive. The second rib structure may be attached to the photovoltaic insert also using an adhesive. In other embodiments, the ribs may be attached to the base portion and/or to the photovoltaic insert using one or more interlocking features. The module may also include one or more removable mechanical connectors for mechanically interconnecting some or all module components, including the base portion, photovoltaic insert, and support unit. In the same or other embodiments, the module includes an electrical connector attached and electrically connected to the photovoltaic insert. The electrical connector may be integrated into the mechanical connector.

In certain embodiments, the base portion includes one or more edge supports extending from the support flap and configured to mechanically attach and provide support to one or more edges of the photovoltaic insert. The edge supports may be used in addition to the support flap, which may be used to provide its own support. The support unit and/or base portion may be made from various materials listed below.

Provided also is a BIP module including a photovoltaic insert having one or more photovoltaic cells and abuse portion having an insert engaging area and a support flap. The insert engaging area supports the photovoltaic insert, which is attached to the front side of the insert engaging area. The back side of the insert engaging area includes a set of open channels, i.e., a first set of channels. In specific embodiments, these channels are at least about 0.25 inches deep and are configured to form ventilation channels. The front side of the support flap area includes another set of open channels, i.e., a second set of channels. In certain embodiments, a first set of channels of one module is configured to coincide with a second set of channels of a like adjacent module (in a parallel row) after installation of the two modules on a building structure.

In certain embodiments, two corners of the insert engaging area are connected to two corresponding corners of the support flap area such that the two areas form an opening extending between these two corners. During fabrication or installation, the photovoltaic insert is partially inserted into this opening. A part of the insert remains under the support flap area of the base portion. The insert may be sealed around the opening with respect to the base portion or, more specifically, with respect to the insert engaging area and the support flap area. In certain embodiments, the insert is configured to interlock with the two corners of the insert engaging area. In the same or other embodiments, the front side of the insert engaging area is attached to the photovoltaic insert using an adhesive. In certain embodiments, the photovoltaic insert includes one or more protrusions controlling how far the photovoltaic insert can extend into the opening. These protrusions may include electrical connectors for establishing electrical connections to adjacent modules.

In certain embodiments, the front side of the insert engaging area includes a third set of open channels for providing ventilation between the support sheet and insert. The back side of the moisture flap area may include a fourth set of open channels for providing ventilation between the support sheet and building structure after installation. The base portion may be made from various materials listed below.

Provided also is a BIP module that includes a photovoltaic insert and a base portion having a support flap and one or more edges. The edges are configured to form one or more removable mechanical connections with the support sheet of the insert. The edges may be also removable from the base portion and installed onto the base portion during fabrication or installation of the module. The base portion may also include two extension members disposed along two edges of the support sheet of the insert and forming mechanical connections with the support sheet. More specifically, the two extension members may be configured to interlock with one or more adjacent BIP modules and form side gutters with these modules.

In certain embodiments, the base portion includes a rib structure attached to and extending away from the support flap. The ribs may be configured to attach and support the photovoltaic insert. For example, the ribs may be attached to the insert using an adhesive. In certain embodiments, the base portion includes one or more connector pockets for accommodating one or more connectors disposed on the photovoltaic insert. The edges of the base portion may include one or more channels for snugly fitting the insert's edges. This fit may provide adequate mechanical support to the insert with respect to the base portion and, as a result, with respect to a building structure. In certain embodiments, the insert is sealed with respect to the base portion along a contact edge.

These and other aspects of the invention are described further below with reference to the figures.

BRIEF DESCRIPTION OF THE DRAWINGS

FIG. 1 is a schematic cross-sectional side view of a building integrable photovoltaic (BIP) module in accordance with certain embodiments.

FIG. 2 is a schematic top view of a BIP module in accordance with certain embodiments.

DETAILED DESCRIPTION OF EXAMPLE EMBODIMENTS

Figure 3:
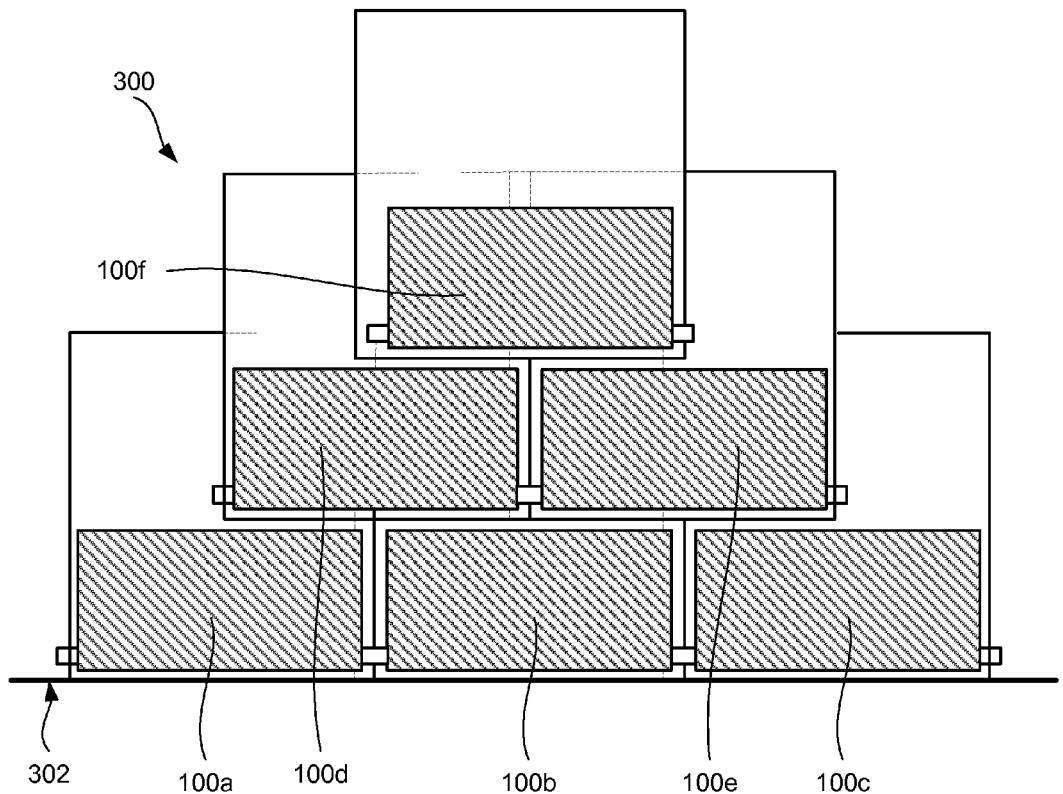
FIG. 3 illustrates a subset of a photovoltaic array that includes six BIP modules in accordance with certain embodiments.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Building-integrable photovoltaic (BIP) modules are photovoltaic modules specially configured for integration into various parts of building structures, such as rooftops, skylights, or facades. In certain examples, the BIP modules are used to replace conventional building materials, such as asphalt shingles. Unlike conventional photovoltaic systems, BIP modules often do not require separate mounting hardware and may be installed directly onto the building structures and even replace some building materials. As such, installed BIP modules may provide substantial savings over conventional systems in terms of building materials and labor costs. For example, asphalt roof shingles may be completely or partially replaced by BIP modules referred to as "photovoltaic shingles."

Provided herein are novel BIP modules that include photovoltaic inserts for producing electrical power output and various supporting structures for mechanically attaching and supporting the photovoltaic insert with respect to a building structure. Some examples of these supporting structures include base trays or base portions including base sheets and support flaps. The supporting structures may include ventilation ribs that form ventilation channels for providing an air flow under the photovoltaic insert. In certain embodiments, ventilation channels are also provided under other components of the BIP module, which allows controlling the temperature of photovoltaic cells and improves performance of the modules. In specific embodiments, ventilation channels of one module are configured to coincide with ventilation channels of one or more other like modules to form one or more continuous channels, for example along a roof edge. The supporting structures may form moisture barriers in between two modules, such as side gutters. In certain embodiments, supporting structures are separate components and are attached to the insert to form a module during fabrication or installation of the module on a building structure.

To provide a better understanding of various features of BIP modules and methods of integrating connectors with photovoltaic inserts during module fabrication, some examples of BIP modules will now be briefly described. FIG. 1 is a schematic cross-sectional end view (line 1-1 in FIG. 2 indicates the position of this cross-section) of a BIP module 100 in accordance with certain embodiments. BIP module 100 may have one or more photovoltaic cells 102 that are electrically interconnected. Photovoltaic cells 102 may be interconnected in parallel, in series, or in various combinations of these. Examples of photovoltaic cells include copper indium gallium selenide (CIGS) cells, cadmium-telluride (Cd—Te) cells, amorphous silicon (a-Si) cells, micro-crystalline silicon cells, crystalline silicon (c-Si) cells, gallium arsenide multi-junction cells, light adsorbing dye cells, organic polymer cells, and other types of photovoltaic cells.

Photovoltaic cell 102 has a photovoltaic layer that generates a voltage when exposed to sunlight. In certain embodiments, the photovoltaic layer includes a semiconductor junction. The photovoltaic layer may be positioned adjacent to a back conductive layer, which, in certain embodiments, is a thin layer of molybdenum, niobium, copper, and/or silver. Photovoltaic cell 102 may also include a conductive substrate, such as stainless steel foil, titanium foil, copper foil, aluminum foil, or beryllium foil. Another example includes a conductive oxide or metallic deposition over a polymer film, such as polyimide. In certain embodiments, a substrate has a thickness of between about 2 mils and 50 mils (e.g., about 10 mils), with other thicknesses also within the scope. Photovoltaic cell 102 may also include a top conductive layer. This layer typically includes one or more transparent conductive oxides (TCO), such as zinc oxide, aluminum-doped zinc oxide (AZO), indium tin oxide (ITO), and gallium doped zinc oxide. A typical thickness of a top conductive layer is between about 100 nanometers to 1,000 nanometers (e.g., between about 200 nanometers and 800 nanometers), with other thicknesses within the scope.

In certain embodiments, photovoltaic cells 102 are interconnected using one or more current collectors (not shown). The current collector may be attached and configured to collect electrical currents from the top conductive layer. The current collector may also provide electrical connections to adjacent cells as further described with reference to of FIG. 5, below. The current collector includes a conductive component (e.g., an electrical trace or wire) that contacts the top conductive layer (e.g., a TCO layer). The current collector may further include a top carrier film and/or a bottom carrier film, which may be made from transparent insulating materials to prevent electrical shorts with other elements of the cell and/or module. In certain embodiments, a bus bar is attached directly to the substrate of a photovoltaic cell. A bus bar may also be attached directly to the conductive component of the current collector. For example, a set of photovoltaic cells may be electrically interconnected in series with multiple current collectors (or other interconnecting wires). One bus bar may be connected to a substrate of a cell at one end of this set, while another bus bar may be connected to a current collector at another end.

Photovoltaic cells 102 may be electrically and environmentally insulated between a front light-incident sealing sheet 104 and a back sealing sheet 106. Examples of sealing sheets include glass, polyethylene, polyethylene terephthalate (PET), polypropylene, polybutylene, polybutylene terephthalate (PBT), polyphenylene oxide (PPO), polyphenylene sulfide (PPS) polystyrene, polycarbonates (PC), ethylene-vinyl acetate (EVA), fluoropolymers (e.g., polyvinyl fluoride (PVF), polyvinylidene fluoride (PVDF), ethylene-terafluoethylene (ETFE), fluorinated ethylene-propylene (FEP), perfluoroalkoxy (PFA) and polychlorotrifluoroethane (PCTFE)), acrylics (e.g., poly(methyl methacrylate)), silicones (e.g., silicone polyesters), and/or polyvinyl chloride (PVC), as well as multilayer laminates and co-extrusions of these materials. A typical thickness of a sealing sheet is between about 5 mils and 100 mils or, more specifically, between about 10 mils and 50 mils. In certain embodiments, a back sealing sheet includes a metallized layer to improve water permeability characteristics of the sealing sheet. For example, a metal foil may be positioned in between two insulating layers to form a composite back sealing sheet. In certain embodiments, a module has an encapsulant layer positioned between one or both sealing sheets 104, 106 and photovoltaic cells 102. Examples of encapsulant layer materials include non-olefin thermoplastic polymers or thermal polymer olefin (TPO), such as polyethylene (e.g., a linear low density polyethylene, polypropylene, polybutylene, polyethylene terephthalate (PET), polybutylene terephthalate (PBT), polystyrene, polycarbonates, fluoropolymers, acrylics, ionomers, silicones, and combinations thereof.

BIP module 100 may also include an edge seal 105 that surrounds photovoltaic cells 102. Edge seal 105 may be used to secure front sheet 104 to back sheet 106 and/or to prevent moisture from penetrating in between these two sheets. Edge seal 105 may be made from certain organic or inorganic materials that have low inherent water vapor transmission rates (WVTR), e.g., typically less than 1-2 g/m$^2$/day. In certain embodiments, edge seal 105 is configured to absorb moisture from inside the module in addition to preventing moisture ingression into the module. For example, a butyl-rubber containing moisture getter or desiccant may be added to edge seal 105. In certain embodiments, a portion of edge seal 105 that contacts electrical components (e.g., bus bars) of BIP module 100 is made from a thermally resistant polymeric material. Various examples of thermally resistant materials and RTI ratings are further described below.

BIP module 100 may also have a support sheet 108 attached to back side sea sheet 106. The attachment may be provided by a support edge 109, which, in certain embodiments, is a part of support sheet 108. Support sheets may be made, for example, from rigid materials. Some examples of rigid materials are provided below.

In certain embodiments, support sheet 108 may be attached to back sheet 106 without a separate support edge or other separate supporting element. For example, support sheet 108 and back sheet 106 may be laminated together or support sheet 108 may be formed (e.g., by injection molding) over back sheet 106. In other embodiments back sealing sheet 106 serves as a support sheet. In this case, the same element used to seal photovoltaic cells 102 may be positioned over and contact a roof structure (not shown). Support sheet 108 may have one or more ventilation channels 110 to allow for air to flow between BIP module 100 and a building surface, e.g., a roof-deck or a water resistant underlayment/membrane on top of the roof deck. Ventilation channels 110 may be used for cooling BIP module during its operation. For example, it has been found that each 1° C. of heating from an optimal operating temperature of a typical CIGS cell causes the efficiency loss of about 0.33% to 0.5%.

BIP module 100 has one or more electrical connectors 112 for electrically connecting BIP module 100 to other BIP modules and array components, such as an inverter and/or a battery pack. In certain embodiments, BIP module 100 has two electrical connectors 112 positioned on opposite sides (e.g., the short or minor sides of a rectangular module) of BIP module 100, as for example shown in FIGS. 1 and 2, for example. Each one of two electrical connectors 112 has at least one conductive element electrically connected to photovoltaic cells 102. In certain embodiments, electrical connectors 112 have additional conductive elements, which may or may not be directly connected to photovoltaic cells 102. For example, each of two connectors 112 may have two conductive elements, one of which is electrically connected to photovoltaic cells 102, while the other is electrically connected to a bus bar (not shown) passing through BIP module 100. This and other examples are described in more detail in the context of FIGS. 6 and 7. In general, regardless of the number of connectors 112 attached to BIP module 100, at least two conductive elements of these connectors 112 are electrically connected to photovoltaic cells 102.

FIG. 2 is a schematic top view of BIP module 100 in accordance with certain embodiments. Support sheet 108 is shown to have a side skirt 204 and atop flap 206 extending beyond a BIP module boundary 202. Side skirt 204 is sometimes referred to as a side flap, while top flap 206 is sometimes referred to as a top lap. In certain embodiments, BIP module 100 does not include side flap 204. BIP module boundary 202 is defined as an area of a module 100 that does not extend under other BIP modules or similar building materials (e.g., roofing shingles) after installation. BIP module boundary 202 includes photovoltaic cells 102. Generally, it is desirable to maximize the ratio of the exposed area of photovoltaic cells 102 to BIP module boundary 202 in order to maximize the "working area" of BIP module 100. It should be noted that, after installation, flaps of other BIP modules typically extend under BIP module boundary 202. In a similar manner, after installation, side flap 204 of BIP module 100 may extend underneath another BIP module positioned on the left (in the same row) of BIP module 100 creating an overlap for moisture sealing. Top flap 206 may extend underneath one or more BIP modules positioned above BIP module 100. Arrangements of BIP modules in an array will now be described in more detail with reference to FIGS. 3 and 4.

FIG. 3 illustrates a photovoltaic array 300 or, more specifically a portion of a photovoltaic array, which includes six BIP modules 100a-100f arranged in three different rows extending along horizontal rooflines in accordance with certain embodiments. Installation of BIP modules 100a-100f generally starts from a bottom roofline 302 so that the top flaps of BIP modules 100a-100f can be overlapped with another row of BIP modules. If a side flap is used, then the position of the side flap (i.e., a left flap or a right flap) determines which bottom corner should be the starting corner for the installation of the array. For example, if a BIP module has a top flap and a right-side flap, then installation may start from the bottom left corner of the roof or of the photovoltaic array. Another BIP module installed later in the same row and on the right of the initial BIP module will overlap the side flap of the initial BIP module. Furthermore, one or more BIP modules installed in a row above will overlap the top flap of the initial BIP module. This overlap of a BIP module with a flap of another BIP module creates a moisture barrier.

Figure 4:
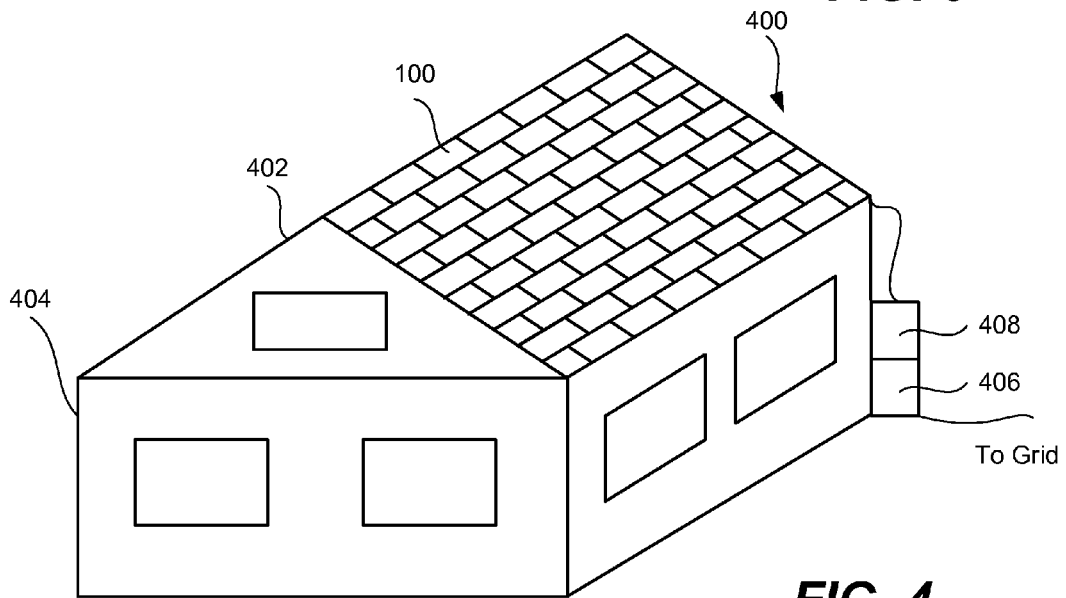
FIG. 4 is a schematic illustration of a photovoltaic array installed on a rooftop of a building structure in accordance with certain embodiments.

FIG. 4 is a schematic illustration of a photovoltaic array 400 installed on a rooftop 402 of a building structure 404 for protecting building structure 404 from the environment as well as producing electricity in accordance with certain embodiments. Multiple BIP modules 100 are shown to fully cover one side of rooftop 402 (e.g., a south side or the side that receives the most sun). In other embodiments, multiple sides of rooftop 402 are used for a photovoltaic array. Furthermore, some portions of rooftop 402 may be covered with conventional roofing materials (e.g., asphalt shingles). As such, BIP modules 100 may also be used in combination with other roofing materials (e.g., asphalt shingles) and cover only a portion of rooftop. Generally, BIP modules 100 may be used on steep sloped to low slope rooftops. For example, the rooftops may have a slope of at least about 2.5-to-12 or, in many embodiments, at least about 3-to-12.

Multiple BIP modules 100 may be interconnected in series and/or in parallel with each other. For example, photovoltaic array 400 may have sets of BIP modules 100 interconnected in series with each other (i.e., electrical connections among multiple photovoltaic modules within one set), while these sets are interconnected in parallel with each other (i.e., electrical connections among multiple sets in one array). Photovoltaic array 400 may be used to supply electricity to building structure 404 and/or to an electrical grid. In certain embodiments, photovoltaic array 400 includes an inverter 406 and/or a battery pack 408. Inverter 406 is used for converting a direct current (DC) generated by BIP modules 100 into an alternating current (AC). Inverter 406 may be also configured to adjust a voltage provided by BIP modules 100 or sets of BIP modules 100 to a level that can be utilized by building structure 404 or by a power grid. In certain embodiments, inverter 406 is rated up to 600 volts DC input or even up to 1000 volts DC, and/or up to 10 kW power. Examples of inverters include a photovoltaic static inverter (e.g., BWT10240—Gridtec 10, available from Trace Technologies in Livermore, Calif.) and a string inverter (e.g. Sunny Boy RTM.2500 available from SMA America in Grass Valley, Calif.). In certain embodiments, BIP modules may include integrated inverters, i.e., "on module" inverters. These inverters may be used in addition to or instead of external inverter 406. Battery pack 408 is used to balance electric power output and consumption.

Figure 5:
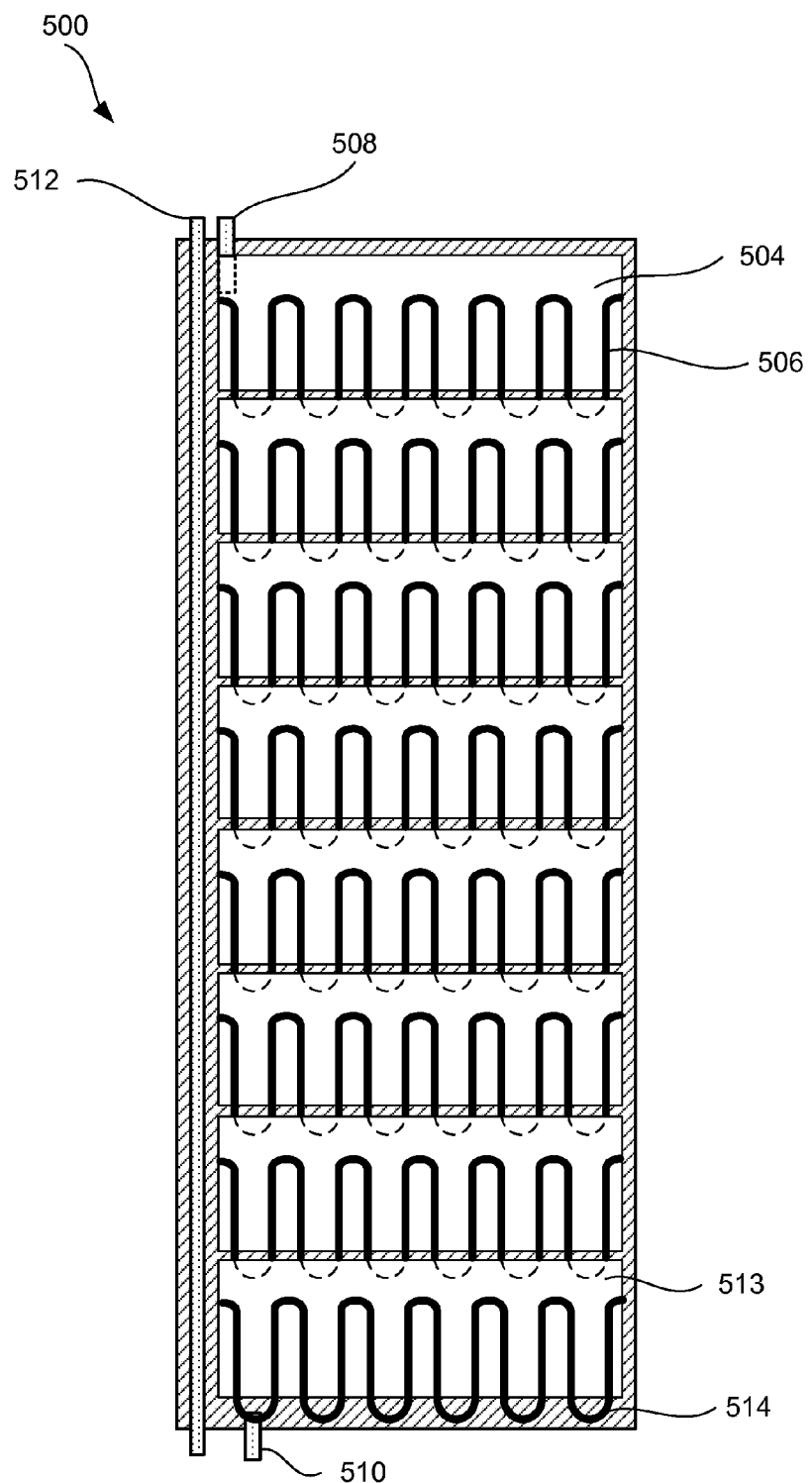
FIG. 5 is a schematic representation of a photovoltaic module having electrically interconnected photovoltaic cells in accordance with certain embodiments.

FIG. 5 is a schematic representation of a photovoltaic module insert 500 illustrating photovoltaic cells 504 electrically interconnected in series using current collectors/interconnecting wires 506 in accordance with certain embodiments. Often individual cells do not provide an adequate output voltage. For example, a typical voltage output of an individual CIGS cell is only between 0.4V and 0.7V. To increase voltage output, photovoltaic cells 504 may be electrically interconnected in series for example, shown in FIG. 5 and/or include "on module" inverters (not shown). Current collectors/interconnecting wires 506 may also be used to provide uniform current distribution and collection from one or both contact layers.

As shown in FIG. 5, each pair of photovoltaic cells 504 has one interconnecting wire positioned in between the two cells and extending over a front side of one cell and over a back side of the adjacent cell. For example, a top interconnecting wire 506 in FIG. 5 extends over the front light-incident side of cell 504 and under the back side of the adjacent cell. In the figure, the interconnecting wires 506 also collect current from the TCO layer and provide uniform current distribution, and may be referred to herein as current collectors. In other embodiments, separate components are used to for current collection and cell-cell interconnection. End cell 513 has a current collector 514 that is positioned over the light incident side of cell 513 but does not connect to another cell. Current collector 514 connects cell 513 to a bus bar 510. Another bus bar 508 may be connected directly to the substrate of the cell 504 (i.e., the back side of cell 504). In another embodiment, a bus bar may be welded to a wire or other component underlying the substrate. In the configuration shown in FIG. 5, a voltage between bus bars 508 and 510 equals a sum of all cell voltages in insert 500. Another bus bar 512 passes through insert 500 without making direct electrical connections to any photovoltaic cells 504. This bus bar 512 may be used for electrically interconnecting this insert in series without other inserts as further described below with reference to FIG. 6. Similar current collectors/interconnecting wires may be used to interconnect individual cells or set of cells in parallel (not shown).

Figure 6:
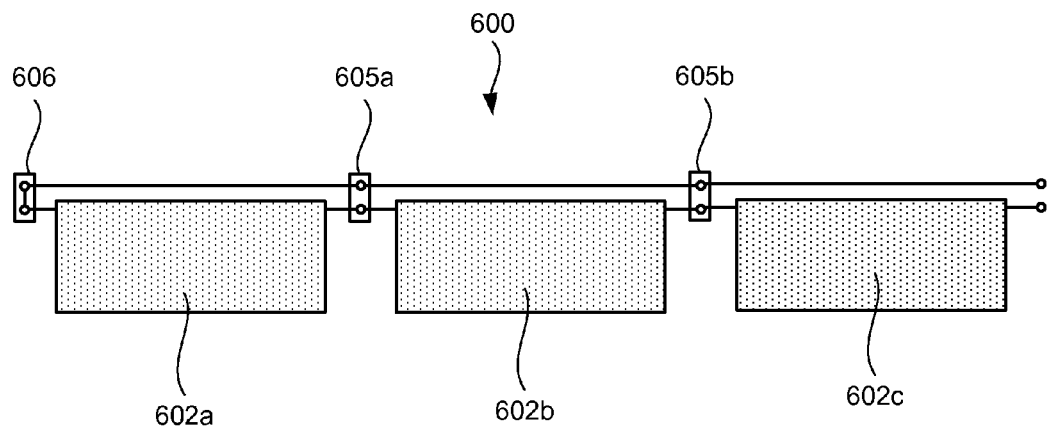
FIG. 6 is a schematic electrical diagram of a photovoltaic array having three BIP modules interconnected in series in accordance with certain embodiments.

BIP modules themselves may be interconnected in series to increase a voltage of a subset of modules or even an entire array. FIG. 6 illustrates a schematic electrical diagram of a photovoltaic array 600 having three BIP modules 602a-602c interconnected in series using module connectors 605a, 605b, and 606 in accordance with certain embodiments. A voltage output of this three-module array 600 is a sum of the voltage outputs of three modules 602a-602c. Each module connector 605a and 605b shown in FIG. 6 may be a combination of two module connectors of BIP modules 602a-602c. These embodiments are further described with reference to FIGS. 8A-8C. In other words, there may be no separate components electrically interconnecting two adjacent BIP modules, with the connection instead established by engaging two connectors installed on the two respective modules. In other embodiments, separate connector components (i.e., not integrated into or installed on BIP modules) may be used for connecting module connectors of two adjacent modules.

Module connector 606 may be a special separate connector component that is connected to one module only. It may be used to electrically interconnect two or more conductive elements of the same module connector.

Figure 7:
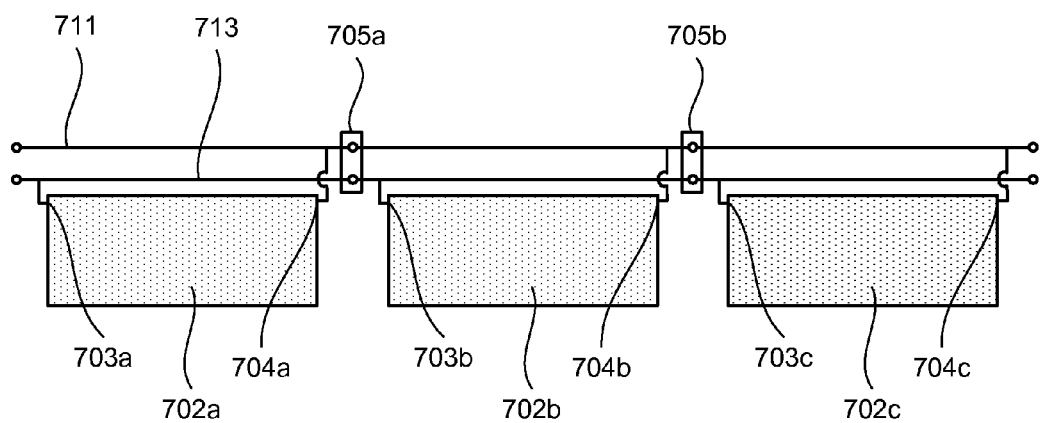
FIG. 7 is a schematic electrical diagram of another photovoltaic array having three BIP modules interconnected in parallel in accordance with other embodiments.

Sometimes BIP modules may need to be electrically interconnected in parallel. FIG. 7 illustrates a schematic electrical diagram of a photovoltaic array 700 having three BIP modules 702a-702c interconnected in parallel using module connectors 705a and 705b in accordance with certain embodiments. Each module may have two bus bars extending through the module, i.e., a "top" bus bar 711 and a "bottom" bus bar 713 as shown in FIG. 7. Top bus bars 711 of each module are connected to right electrical leads 704a, 704b, and 704c of the modules, while bottom bus bars 713 are connected to left electrical leads 703a, 703b, and 703c. A voltage between the top bus bars 711 and bottom bus bars 713 is therefore the same along the entire row of BIP modules 702a-702c.

Figure 8A:
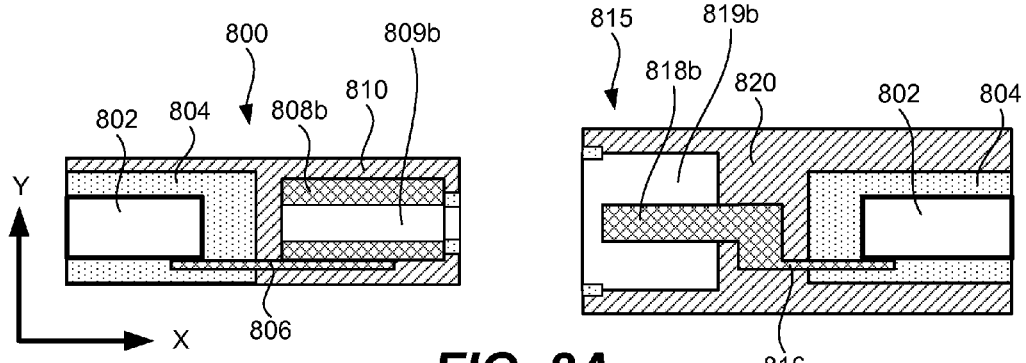
FIGS. 8A-8C are schematic cross-sectional views of two connectors configured for interconnection with each other in accordance with certain embodiments.

FIG. 8A is a schematic cross-sectional side view of two connectors 800 and 815 configured for interconnection with each other, in accordance with certain embodiments. For simplicity, the two connectors are referred to as a female connector 800 and a male connector 815. Each of the two connectors 800 and 815 is shown attached to its own photovoltaic insert, which includes photovoltaic cells 802 and one or more sealing sheets 804. Connectors 800 and 815 include conductive elements 808b and 818b, respectively, which are shown to be electrically connected to photovoltaic cells 802 using bus bars 806 and 816, respectively.

In certain embodiments, a conductive element of one connector (e.g., conductive element 808b of female connector 800) is shaped like a socket/cavity and configured for receiving and tight fitting a corresponding conductive element of another connector (e.g., conductive element 818b of male connector 815). Specifically, conductive element 808b is shown forming a cavity 809b. This tight fitting and contact in turn establishes an electrical connection between the two conductive elements 808b and 818b. Accordingly, conductive element 818b of male connector 815 may be shaped like a pin (e.g., a round pin or a flat rectangular pin). A socket and/or a pin may have protrusions (not shown) extending towards each other (e.g., spring loaded tabs) to further minimize the electrical contact resistance by increasing the overall contact area. In addition, the contacts may be fluted to increase the likelihood of good electrical contact at multiple points (e.g., the flutes guarantee at least as many hot spot asperities of current flow as there are flutes).

Figure 8B:
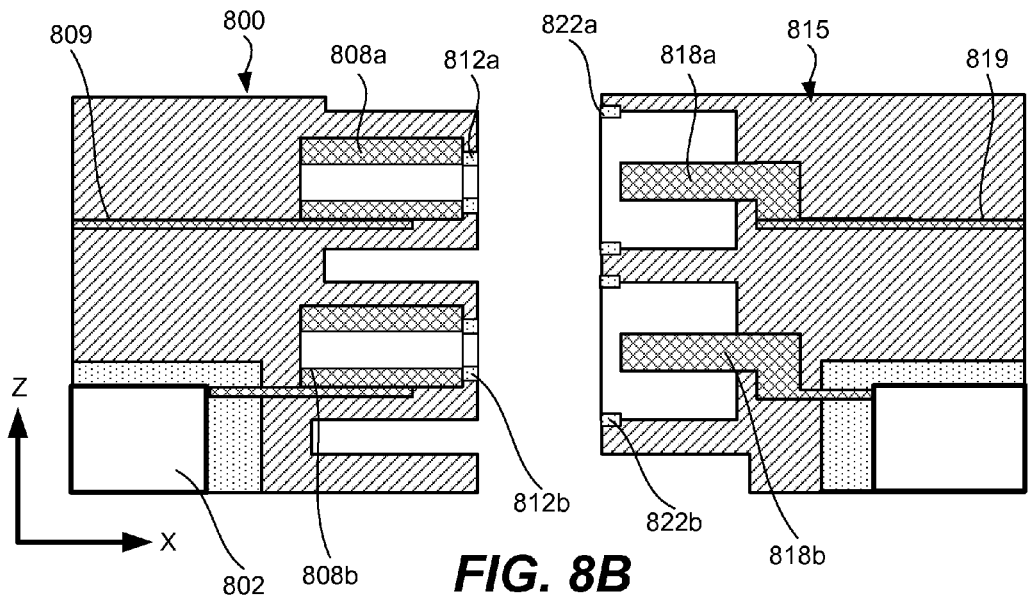
Figure 8C:
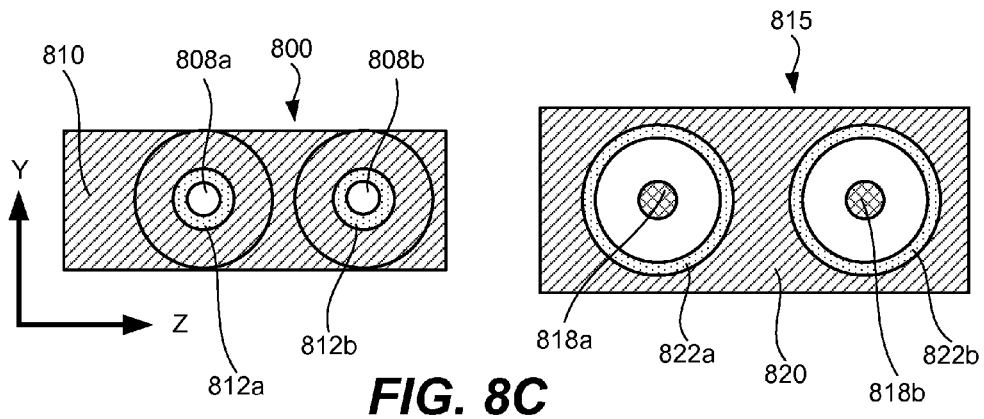

In certain embodiments, connectors do not have a cavity-pin design as shown in FIGS. 8A-8C. Instead, an electrical connection may be established when two substantially flat surfaces contact each other. Conductive elements may be substantially flat or have some topography designed to increase a contact surface over the same projection boundary and/or to increase contact force at least in some areas. Examples of such surface topography features include multiple pin-type or rib-type elevations or recesses.

In certain embodiments, one or more connectors attached to a BIP module have a "touch free" design, which means that an installer cannot accidentally touch conductive elements or any other electrical elements of these connectors during handling of the BIP module. For example, conductive elements may be positioned inside relatively narrow cavities. The openings of these cavities are too small for a finger to accidentally come in to contact with the conductive elements inside the cavities. One such example is shown in FIG. 8A where male connector 815 has a cavity 819b formed by connector body 820 around its conductive pin 818b. While cavity 819b may be sufficiently small to ensure a "touch free" designed as explained above, it is still large enough to accommodate a portion of connector body 810 of female connector 800. In certain embodiments, connector bodies 810 and 820 have interlocking features (not shown) that are configured to keep the two connectors 800 and 815 connected and prevent connector body 810 from sliding outs of cavity 819b. Examples of interlocking features include latches, threads, and various recess-protrusion combinations.

FIG. 8B is schematic plan view of female connector 800 and male connector 815, in accordance with certain embodiments. Each connector 800, 815 is shown with two conductive elements (i.e., conductive sockets 808a and 808b in connector 800 and conductive pins 818a and 818b in connector 815). One conductive element (e.g., socket 808b and pin 818b) of each connector is shown to be electrically connected to photovoltaic cells 802. Another conductive element of each connector 800, 815 may be connected to bus bars (e.g., bus bars 809 and 819) that do not have an immediate electrical connection to photovoltaic cells 802 of their respective BIP module (the extended electrical connection may exist by virtue of a complete electrical circuit).

As shown, sockets 808a and 808b may have their own designated inner seals 812a and 812b. Inner seals 812a and 812b are designed to provide more immediate protection to conductive elements 808a and 818a after connecting the two connectors 800, 815. As such, inner seals 812a and 812b are positioned near inner cavities of sockets 808a and 808b. The profile and dimensions of pins 818a and 818b closely correspond to that of inner seals 812a and 812b. In the same or other embodiments, connectors 800, 815 have external seals 822a and 822b. External seals 822a and 822b may be used in addition to or instead of inner seals 812a and 812b. Various examples of seal materials and fabrication methods are described below in the context of FIG. 9. FIG. 8C is schematic front view of female connector 800 and male connector 815, in accordance with certain embodiments. Connector pins 818a and 818b are shown to have round profiles. However, other profiles (e.g., square, rectangular) may also be used for pins 818a and 818b and conductive element cavities 808a and 808b.

Figure 9A:
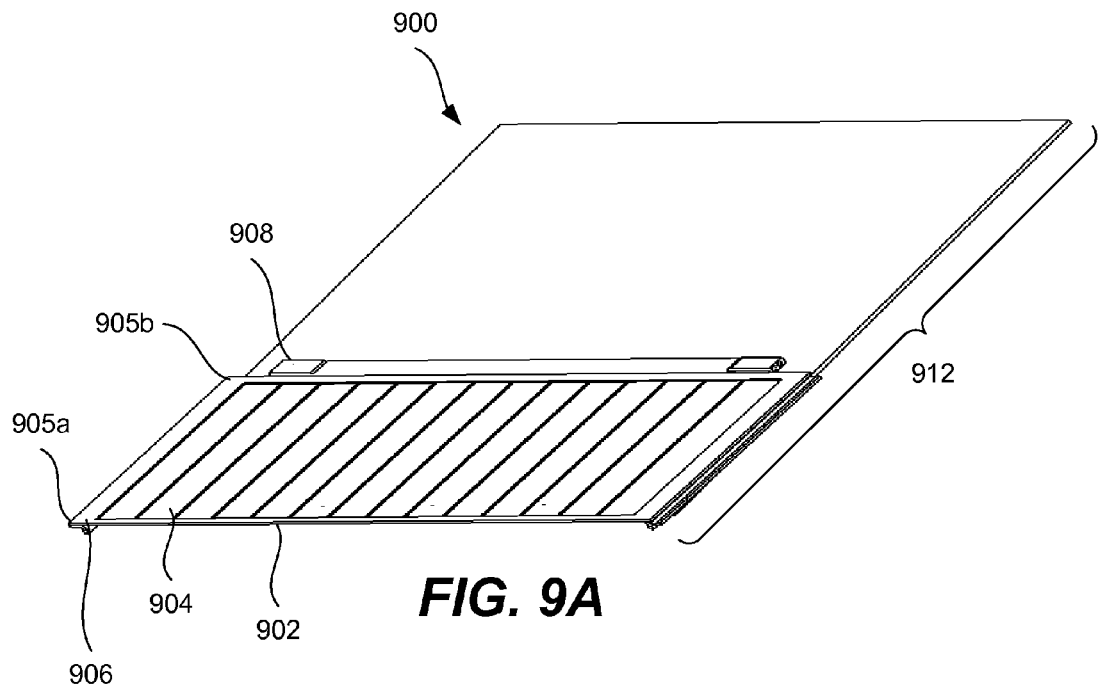
FIG. 9A is a schematic perspective view of a building integrable photovoltaic (BIP) module having a photovoltaic insert positioned on a base tray in accordance with certain embodiments.

FIG. 9A is a schematic perspective view of a BIP module 900 with a photovoltaic insert 902 positioned on a base tray 912 in accordance with certain embodiments. Photovoltaic insert 902 includes a support sheet 906 and one or more photovoltaic cells 904 positioned on support sheet 906. In certain embodiments, photovoltaic insert 902 includes ten or more copper indium gallium (di)selenide (CIGS) cells electrically interconnected in series. Support sheet 906 may be made from rigid and soft polymer materials. Some examples of rigid materials include polyethylene terephthalate (e.g., RYNITE® available from Du Pont in Wilmington, Del.), polybutylene terephthalate (e.g., CRASTIN® also available from Du Pont), nylon in any of its engineered formulations of Nylon 6 and Nylon 66, polyphenylene sulfide (e.g., RYTON® available from Chevron Phillips in The Woodlands, Tex.), polyamide (e.g., ZYTEL® available from DuPont), polycarbonate (PC), polyester (PE), polypropylene (PP), and polyvinyl chloride (PVC) and weatherable engineering thermoplastics such as PPO (polyphenylene oxide), polymethyl methacrylate, PPE (polyphenylene), styrene-acrylonitrile (SAN), polystyrene and blends based on those materials. In addition, weather able thermosets such as unsaturated polyester (UP) and epoxy would be applicable. Examples softer polymer materials include polyethylene, polypropylene, TPO, thermoplastic rubber, thermoplastic elastomer, ethylene propylene diene monomer (EPDM), various fluoroelastomers or thermoplastic vulcanizates (TPV), and flexible cast thermoset materials such as urethanes or silicones. In general, flexible thermoplastic elastomers that have suitable thermally durable behavior may be used. Some specific examples include SANTOPRENE® (Supplied by Exxon Mobil in Houston, Tex.), HIPEX® (Supplied by Sivaco in Santa Clara, Calif.), EFLEX® (Supplied by E-Polymers MSOLP048/IDF227 4 Co., Ltd. In Seoul, Korea), ENFLEX® (Supplied by Enplast Limited in Longford, Ireland), EXCELINK® (Supplied by JSR Corporation in Tokyo, Japan), SYNOPRENE® (Supplied by Synoprene Polymers Pvt. Ltd. in Mumbai, India), and ELASTRON® (Supplied by Elastron Kimya in Kocaeli, Turkey). The properties of any of the above materials may be enhanced with various additives, such as fire retardants, color pigments, anti-tracking, and ignition resistant materials. For example, glass or mineral fibers, powders, and/or spheres may be used to enhance the structural integrity, surface properties, and/or weight reduction of the base polymer materials. Other examples of additives include additives anti-oxidants, moisture scavengers, blowing or foaming agents, mold release additives, light screeners (e.g., carbon black and titanium oxide), UV absorbers (e.g., hydroxybenzophenones, hydroxybenzotriazoles, hydroxyphenyltriazines, and titanium oxide), excited-state quenchers (e.g., metal chelates such as nickel chelates and transition metal chelates), hydro-peroxide decomposers (e.g., phosphate esters, nickel chelates, dithiocarbamates, and mercaptobenzothiazoles), and free-radical scavengers (e.g., hindered amine light stabilizer (HALS)).

In the same or other embodiments, the flexible polymeric shell may extend over a portion of the photovoltaic insert. It should be noted that the use of the adhesive strip that holds these down under the leading lip allows using softer materials. Furthermore, ribs may be used as a stiffener to link the photovoltaic insert to the flap but may also suffice to provide support under the photovoltaic insert and flap so that the connectors on either side are not the sole supports. Photovoltaic insert 902 may also include one or more electrical connectors 908 to form electrical connections with one or more adjacent BIP modules during installation of the photovoltaic array.

Figure 9B:
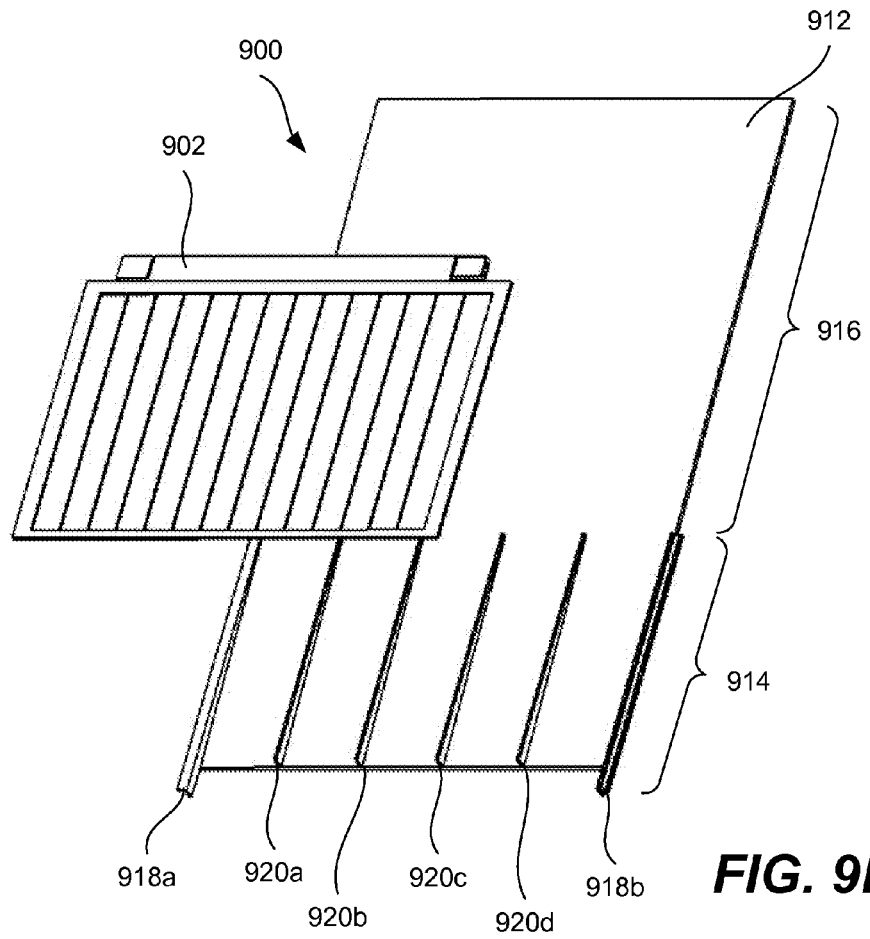
FIG. 9B is a schematic perspective view of the same BIP as in FIG. 9A module prior to positioning the photovoltaic insert on the base tray illustrating additional features of the module.

FIG. 9B is a schematic perspective view of the same BIP module 900 showing the photovoltaic insert 902 detached from the base tray 912, for illustration of some additional features of the module, in particular, features that are located in between photovoltaic insert 902 and base tray 912. Base tray 912 includes abase sheet 914 that extends under insert 912 when module 900 is in the assembled state. Base tray 912 also includes two or more ventilation ribs, such as edge ribs 918a and 918b and inner ribs 920a-920d, that are attached to and extend from base sheet 914 towards insert 902. The ventilation ribs are used to support insert 902 and to form a gap between base sheet 914 and insert 902. In certain embodiments (not shown), ventilation ribs may be provided on the back side of support sheet 906 of insert 902 in addition to or instead of the ventilation ribs on base tray. Such an insert's ribs may be also used for attachment of insert 902 to base sheet 914 and to form ventilation channels in between.

In certain embodiments, base tray 912 also includes two or more additional ventilation ribs extending from the back side of base sheet 914 and away from photovoltaic insert 902 for providing additional ventilation channels between base sheet 914 and the building structure after installing module 900 onto the structure. In these embodiments, there may be two sets of ventilation channels, one between insert 902 and base sheet 914 and another one between base sheet 914 and the building structure. Base sheet 914 may have openings to provide sonic air flow between these two sets of ventilation channels.

As mentioned above, the gap between base sheet 914 and insert 902 may include one or more ventilation channels. In certain embodiments, this gap and, as a result, the corresponding ventilation channels may have a height of at least about 0.25 inches or, more specifically, at least about 0.5 inches or even at least about 1 inch. It is generally desirable to prevent photovoltaic cells 904 from overheating during operation because excessive temperatures may negatively impact a module's performance and lower its power output. The ventilation channels allow air to circulate between insert 902 and base sheet 914 and, in certain embodiments, between other components of module 900 and the building structure after complete assembly and installation of module 900.

In certain embodiments, the ventilation channels between base sheet 914 and insert 902 have openings only along a bottom edge 905a of photovoltaic insert 902. The ventilation channels are sealed along the top edge 905b of insert 902 to prevent water and other environmental contaminants from getting into the channels. In other embodiments, the ventilation channels are open along both edges 905a and 905b of insert 902. Water and other contaminants may be allowed to pass in between insert 902 and base sheet 914 and exit through the openings at bottom edge 905a. The top edge 905b of insert 902 may be also positioned under another top module during installation of the array such that water does not easily get into the ventilation channels but flows from the top module onto the top surface of insert 902. In more specific embodiments, ventilation channels of the two modules (top and bottom) in the two adjacent rows of the photovoltaic array may be aligned to form one or more continuous channels along, for example, the roof edge.

Base tray 912 is configured to be attached to a building structure, such as a roof deck. Some examples of mechanical fasteners and techniques are described below. Base tray 912 is also configured to mechanically support photovoltaic insert 902 with respect to the building structure. As such, base tray 912 may need to be sufficiently rigid to provide enough structural support. In certain embodiments, base tray 912 is made from one or more rigid or flexible materials listed above.

Base tray 912 may include a support flap 916 attached to base sheet 914 along its top edge. Support flap 916 is configured to extend under one or more adjacent modules, e.g., in the upper row of the photovoltaic array. Support flap 916 may be used to provide a moisture seal by creating a large contact surface between two adjacent modules. Furthermore, mechanical connections to the building structure may be made in the support flap area in addition to or instead of connections in the base sheet area. This will minimize a number through holes in the underlying roof sheathing being exposed to the environment because support flap 916 will extend under one or more other modules.

Support flap 916 may be made from the same materials as the rest of base tray 912. More specifically, all components of base tray 912 may be made in one fabrication operation. Alternatively, support flap 916 may be made from different materials and then attached to base sheet 914. In these embodiments, an interface between base sheet 914 and support flap 916 needs to be sealed. In specific embodiments, support flap 916 may be made from one more flexible polymer materials to accommodate misalignments between modules and building structures and provide a good moisture seal. Some specific examples of materials suitable for support flap 916 are listed above. Base tray 912 may include prefabricated holes (e.g., "nail holes") positioned in the areas of base sheet 914 and/or support flap 916 through which mechanical fasteners may be protruded during installation of the module. However, such holes are optional and nails or other fasteners may be driven through the flap/Base tray 912 may include marking, paint, or embossed texture to guide the installer to install fasteners in designated areas. Some examples of mechanical fasteners include nails, screws, and staples.

Base tray 912 is rigidly attached to photovoltaic insert 902 and provides mechanical support to insert 902 with respect to a building structure. In certain embodiments, insert 902 is attached to base tray 912 along one or more of the insert's edges. For example, two edge ventilation ribs 918a and 918b may be used for attachment of insert 902 to base tray 912. Insert 902 may be glued to the ribs and/or attached using various mechanical fasteners. In a specific embodiment, ribs 918a and 918b as well as insert 912 are equipped with corresponding interlocking features. These features may be configured to prevent insert 912 from separating or otherwise moving with respect to base tray 912 after module 900 is assembled. Examples of interlocking features include latches, threads, and various recess-protrusion combinations. In the same or other embodiments, inner ribs 920a-920d are also used for attaching photovoltaic insert 902 to base tray 912. Furthermore, insert 902 may be attached to base tray 912 along insert's top edge 905b.

Generally, photovoltaic insert 902 may be attached to base tray 912 during fabrication of module 900 or during installation of module 900 on a building structure. In other words, in certain embodiments, photovoltaic insert 902 and base tray 912 are provided as two separate components.

Figure 10:
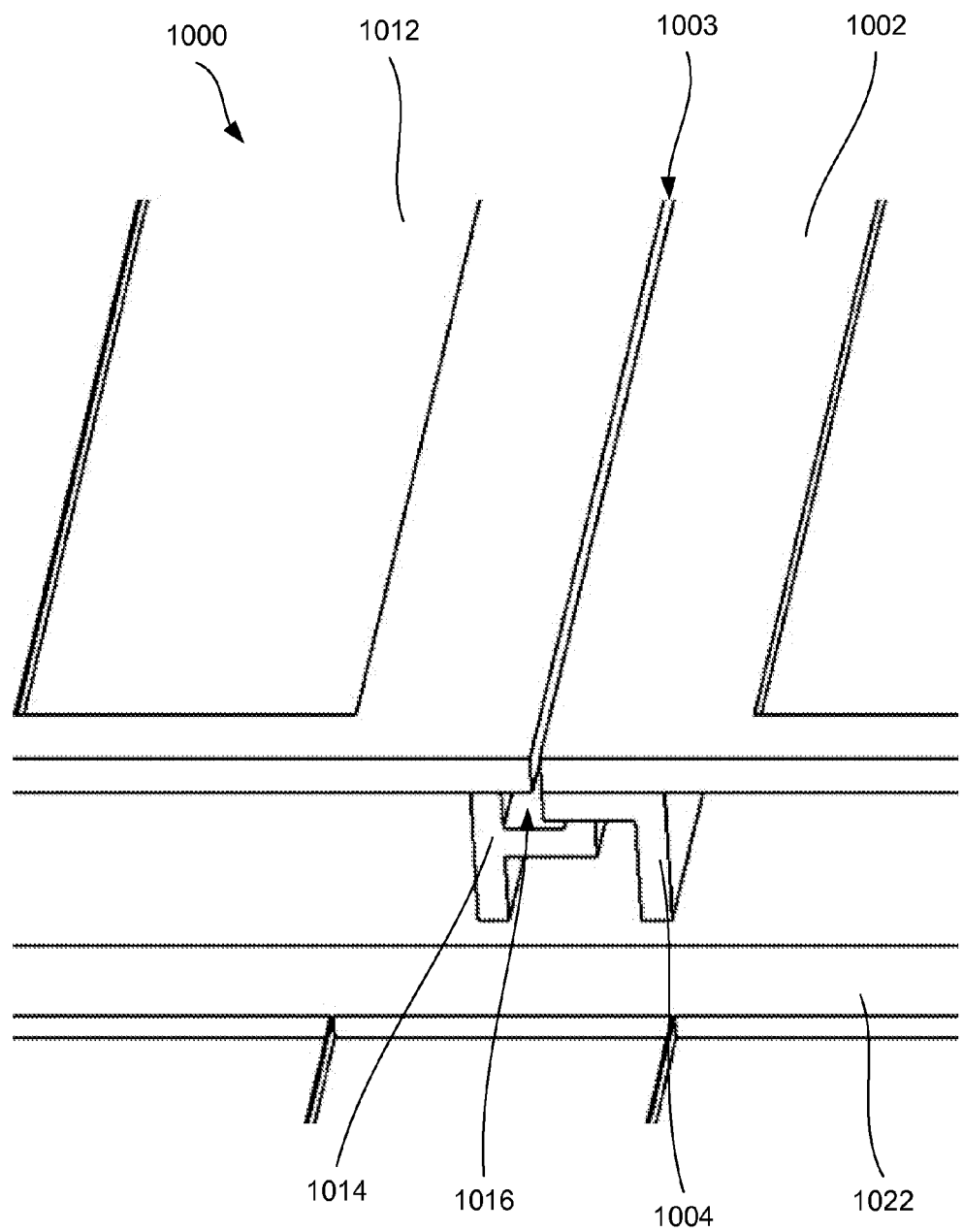
FIG. 10 is a schematic side view of a BIP array illustrating a side gutter formed in between two BIP modules in accordance with certain embodiments.

FIG. 10 is a schematic side view of a BIP array portion 1000 illustrating a "side gutter" 1016 formed by two BIP modules 1002 and 1012 between these modules, in accordance with certain embodiments. Module 1002 includes an "L-shaped" edge 1004, one side of which is attached to the back side of that module. Edge 1004 may be a part of the photovoltaic insert or a part of the base tray. Module 1012 includes an "h-shaped" edge 1014, one side of which is attached to the back side of module 1012. Likewise, edge 1014 may be a part of this module's insert or base tray. Other cross-sectional profiles of the edges may be used as well. When two modules 1002 and 1012 are installed on a building structure, edge 1004 engages with edge 1014 and form side gutter 1016, which is an open channel extending along sides of modules 1002 and 1012. Side gutter 1016 is configured to capture water leaking through a gap 1003 formed by two modules 1002 and 1012 and to deliver that water, for example, over a top surface of a bottom row of modules 1022.

Figure 11A:
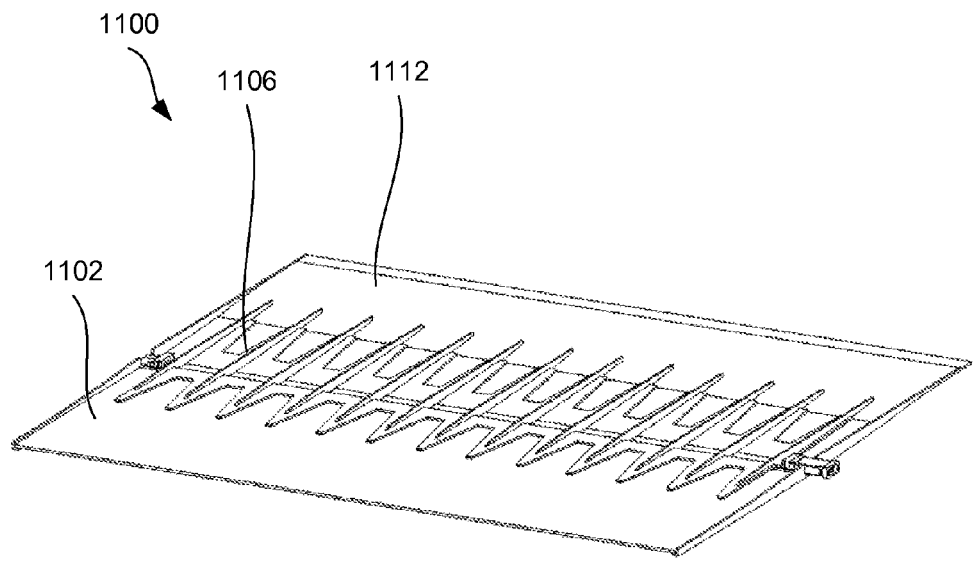
FIG. 11A is a schematic perspective view of another BIP module with a photovoltaic insert secured with respect to a base portion by a support unit having ribs in accordance with certain embodiments.
Figure 11B:
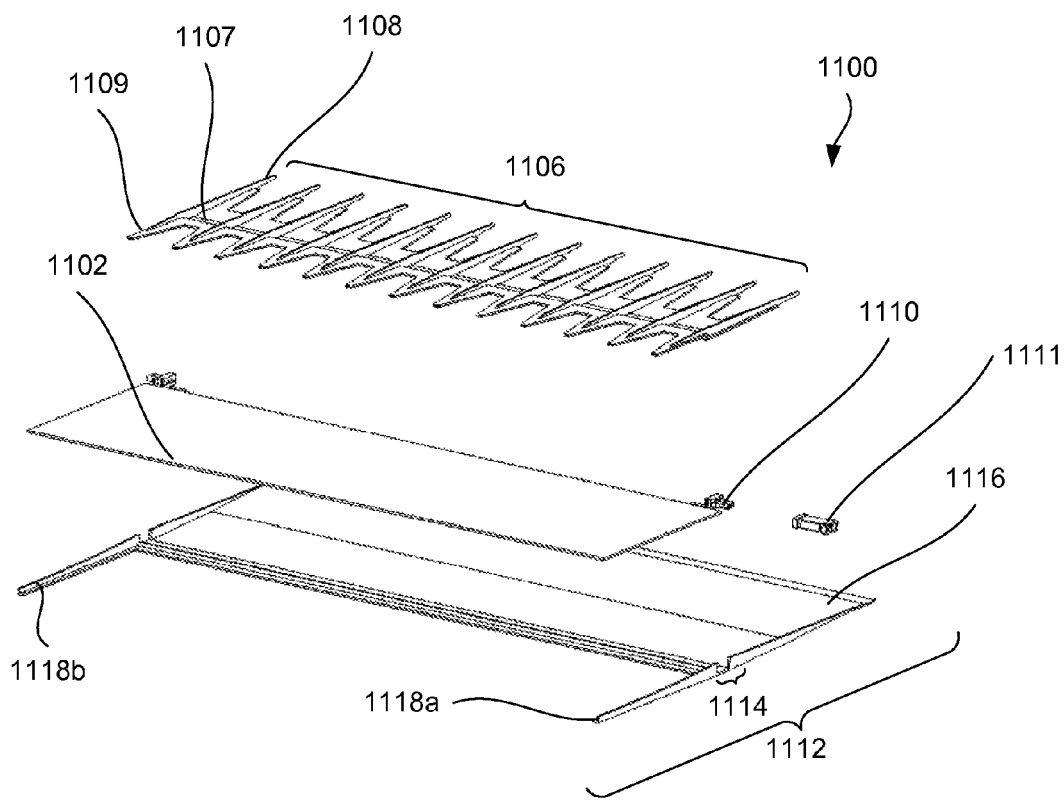
FIG. 11B is a schematic perspective view of the same BIP module as in FIG. 11A prior to interconnecting the photovoltaic insert, base portion, and support unit.

FIG. 11A is a schematic bottom view of another example of a BIP module 1100 having a photovoltaic insert 1102 secured by a support unit 1106 to a base portion 1112 in accordance with certain embodiments. Photovoltaic insert 1102, support unit 1106, and base portion 1112 are separate mechanical components as illustrated in FIG. 11B and may be assembled together during fabrication of module 1100 or during installation of module 1100 on a building structure. Various examples of photovoltaic inserts are described above with reference to FIGS. 9A and 9B. Specifically, photovoltaic insert 1102 includes one or more photovoltaic cells positioned on a support sheet, e.g., ten or more CIGS cells electrically interconnected in series. The support sheet may be made from a rigid material to provide support to the photovoltaic cells and structural integrity to insert 1102.

Likewise, base portion 1112 may be, in some respect, similar to base components described above with reference to FIGS. 9A and 9B. Base portion 1112 is also configured to be attached to a building structure, such as a rooftop board (roof sheathing), and to mechanically support photovoltaic insert 1102 with respect to that structure. Base portion 1112 may be sufficiently rigid to provide structural support. In certain embodiments, base portion 1112 is made from one or more materials listed above.

However, unlike the base components described above, base portion 1112 does not need to include a base sheet extending over the back side of photovoltaic insert 1102 and supporting insert 1102. Instead, mechanical support to insert 1102 may be provided by edge extensions 1118a and 1118b, an edge overlap 1114, and/or support unit 1106.

During assembly of module 1100, edge extensions 1118a and 1118b are positioned along two edges of insert 1102 and attached to these edges to provide mechanical support and protection to these edges. In certain embodiments, edge extensions 1118a and 1118b may be longer than the insert's edges and provide protection to all four corners of insert 1102. Photovoltaic inserts are frequently made with glass sheets covering one or both side of the photovoltaic cells. These glass sheets need to be protected from breaking, in particular, during handling and installation of the modules. Edge extensions 1118a and 1118b may have "L-shaped" cross-sectional profiles. One side of this profile may partially extend over the front surface of insert 1102. Another side of the "L-shaped" profile may fully extend over the edge and, in certain embodiments, extend beyond the edge and above the back side of insert 1102. One or both sides may be attached to insert's respective surfaces using an adhesive or some other attachment features.

Edge overlap 1114 is a part of base portion 1112 that extends over photovoltaic insert 1102 and is used to seal an interface between base portion 1112 and insert 1102 as well as to provide support to insert 1102. More specifically, edge overlap 1114 may extend over a small part of the front side of insert 1102 without blocking the photovoltaic cells. Edge overlap 1114 may be attached to photovoltaic insert with an adhesive and/or some other attachment features, such as a set of interlocking features. Edge overlap 1114 may include one or more cavities for receiving connector 1110, which may be attached to insert 1102 and/or other components of module 1100.

Support unit 1106 includes a cross-bar 1107 and two rib structures 1108 and 1109 attached to and extending away from cross-bar 1107. First rib structure 1108 may extend in a direction substantially opposite to second rib structure 1109. Support unit 1106 may be an integral components that is made from various rigid materials listed above.

First rib structure 1108 is configured to be attached and support base portion 1112 or, more specifically, support flap 1116. After assembly of module 1110, first rib structure 1108 extends under the back side of support flap 1116. First rib structure 1108 may have flat portions that provide a surface for attaching to support flap 1116 using, for example, an adhesive or other attachment features. Second rib structure 1109 is configured to support photovoltaic insert 1102. Similarly, after assembly of module 1100, second rib structure 1109 extends under the back side of insert 1102 and may have flat portions for attaching to insert 1102. In certain embodiments, second rib structure 1109 is configured to form ventilation channels between insert 1102 and a building structure after installation of module 1100. Ribs may also serve to support the module prior or during installation, for example, when the module is stepped on so that the connectors do not have to support the entire load. These ventilation channels may be similar in terms of dimensions, openings, and other features to the ventilation channels described above in reference to FIGS. 9A ad 9B.

In certain embodiments, module 1100 includes one or more internal electrical connectors 1110 mechanically attached to photovoltaic insert 1102 and electrically connected to photovoltaic cells of photovoltaic insert 1102. Electrical connectors 1110 are typically integrated into insert 1102 prior to assembly of module 1100. Specifically, bus bars extending between the photovoltaic cells and connected to electrical terminals of connectors 1110 are sealed with insert 1102. Electrical connectors 1110 may be designed not to extend outside of insert's boundaries (e.g., insert's width, length, or both) to prevent breaking of connectors 1110 during handling of insert 1102 and/or module 1100. Each connector 1110 may have one, two, or more electrical leads for various types of connections to other modules. FIG. 11B also illustrates a connector joiner 1111 used for connecting two electrical connectors 1110 of adjacent modules. In certain embodiments, connector joiner 1111 is formed as a sleeve for extending over electrical connectors 1110. Inside the sleeve, connector joiner 1111 may include one or more conductive elements for interconnecting electrical leads of connectors 1110. Connector joiner 1111 may be provided as a separate component and installed (on electrical connectors 1110) during assembly of a photovoltaic array.

For example, insert 1102 may be supplied with connectors 1110 preinstalled onto insert 1102. Electrical connectors 1110 are later used to form electrical connections to other BIP modules and/or electrical components of the array. Module 1100 may also include one or more removable mechanical connector (not shown) for mechanically interconnecting two or more of the following components: base portion 1112, photovoltaic insert 1102, and support unit 1106. For example, each one of these components may include rigid tabs extending from the side edges of module 1100. The mechanical connectors may be formed as hollow sleeves for snugly fitting over this collection of the tabs on each side of module 1100 and mechanically supporting these three components with respect to each other.

Figure 12A:
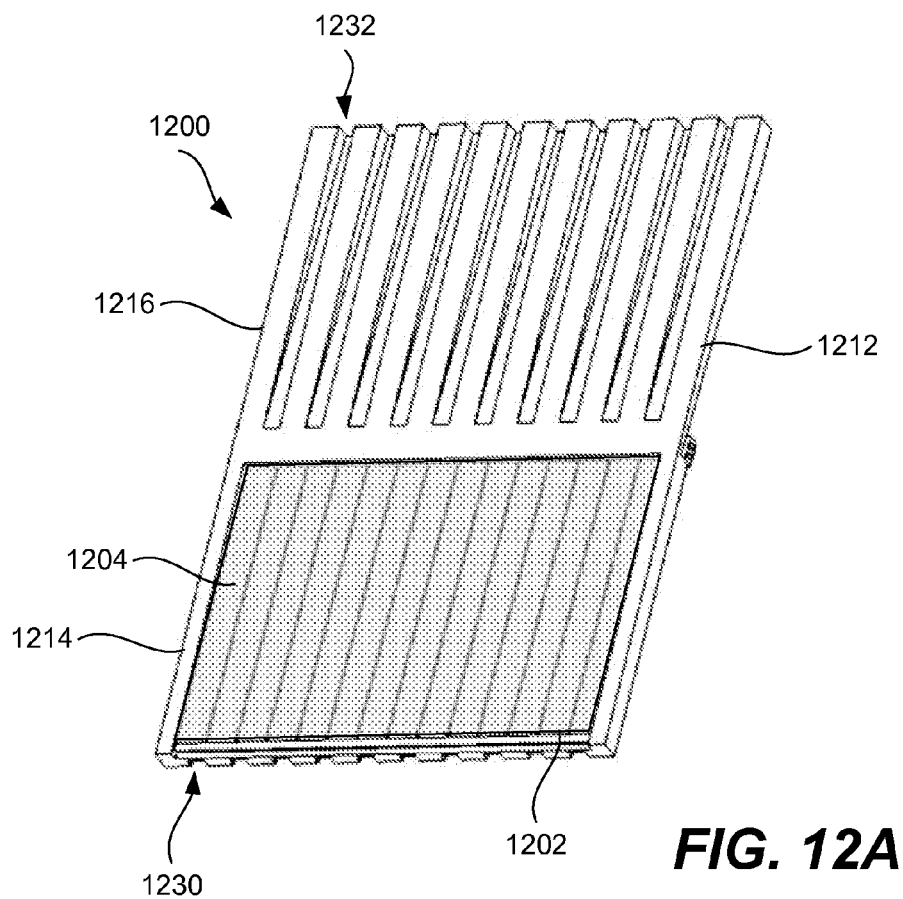
FIG. 12A is a schematic perspective view of yet another BIP module with a photovoltaic insert attached to a base portion that has two sets of open channels in accordance with certain embodiments.

FIG. 12A is a schematic view of yet another example of a BIP module 1200 in accordance with certain embodiments. Module 1200 includes photovoltaic insert 1202 attached to a base portion 1212. Some features of photovoltaic insert 1202 and base portions are described above in reference to FIGS. 9A and 9B as well as FIGS. 11A and 11B. Specifically, photovoltaic insert may include one or more photovoltaic cells 1204 positioned on a support sheet. In certain embodiments, photovoltaic insert 1202 includes ten or more copper indium gallium (di)selenide (CIGS) cells electrically interconnected in series.

Figure 12B:
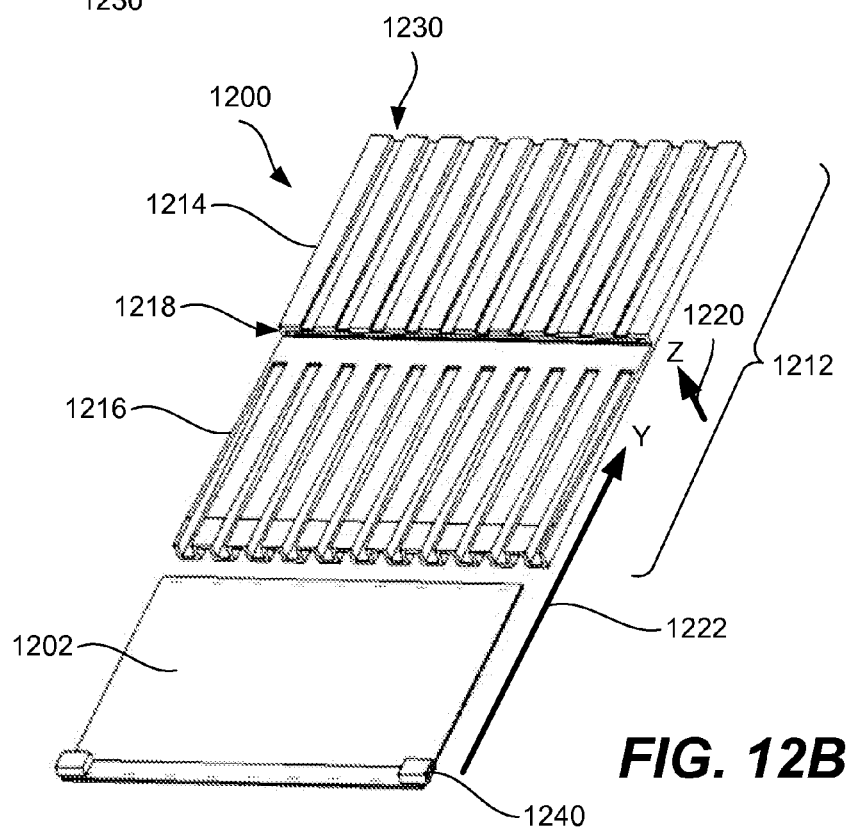
FIG. 12B is a schematic perspective view of the same BIP module as in FIG. 12A prior to attaching the insert to the base portion having the two sets of channels.

To provide a better illustration of certain features, FIG. 12B provides a schematic bottom view of the same BIP module 1200 with the photovoltaic insert 1202 detached from base portion 1212. Base portion 1212 includes an insert engaging area 1214 and a support flap 1216. Insert engaging area 1204 is configured to support photovoltaic insert 1202 after assembly of module 1200. More specifically, photovoltaic insert 1202 is attached to the front side (not visible in FIGS. 12A and 12B) of insert engaging area 1214 using an adhesive or some other attachment features.

In certain embodiments, insert engaging area 1214 and support flap 1216 are vertically offset along a Z-axis 1220 and form an opening 1218 between two connected ends of insert engaging area 1214 and support flap 1216. Insert 1202 is configured to slide into opening 1218 from the back side area of support flap 1216. The sliding direction is shown as a Y-axis 1222. In this embodiment, a process of assembling module 1200 may start with positioning a front side of insert 1202 on the back side of support flap 1216 and sliding insert through opening 1216 until the back side of insert 1202 establishes sufficient contact with the front side of insert engaging area 1214.

Figure 13:
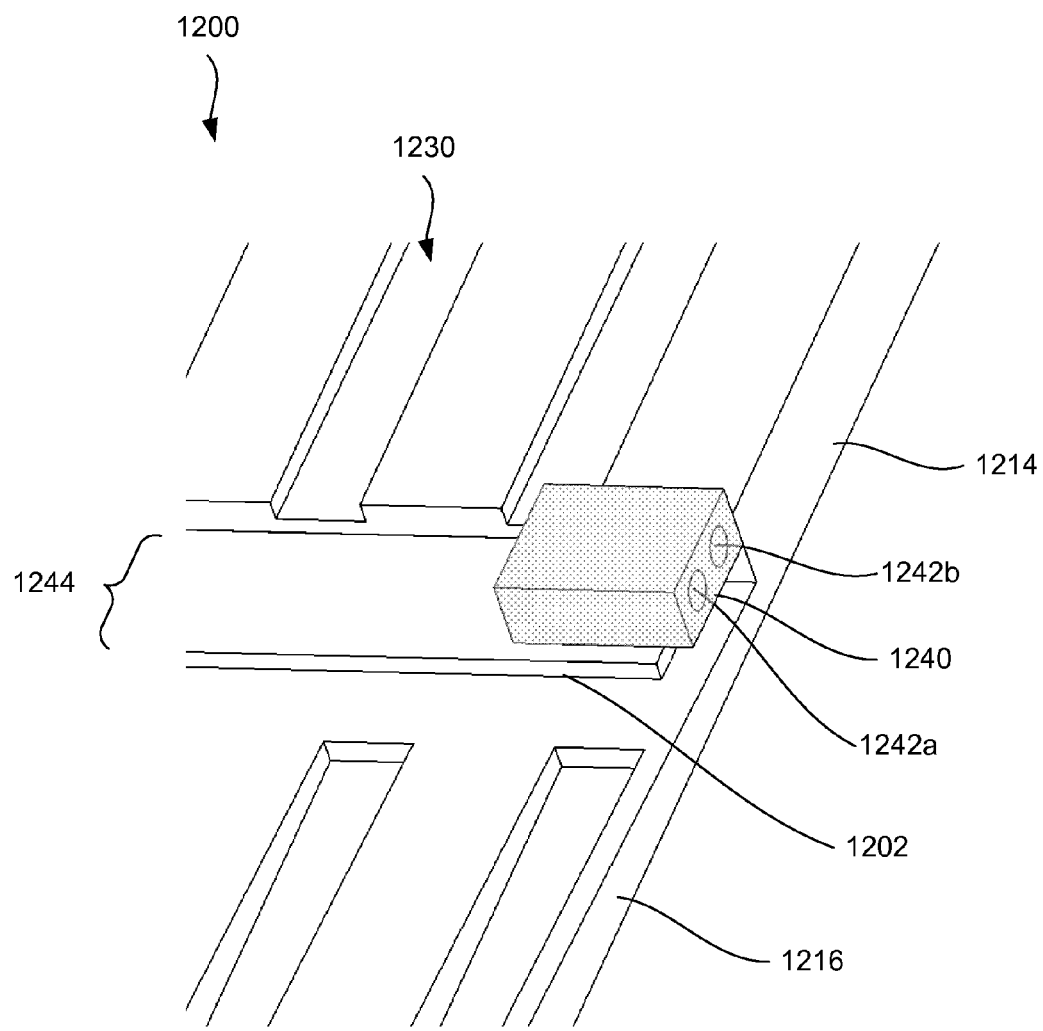
FIG. 13 is a schematic expanded view of a portion of the BIP module illustrating various details of an electrical connector.

The backside of insert 1202 may have one or more features for controlling how far insert 1202 can slide into opening 1218. For example, photovoltaic insert 1202 may include one or more protrusions 1240 controlling that distance. These protrusions may include electrical connectors for making electrical connections to other modules or electrical components of the array. FIG. 13 is a schematic expanded view of a portion of BIP module 1200 illustrating various details of an electrical connector. Connector 1240 is attached to the bask side of insert 1202 and in the assembled state acts a stopper preventing insert from further extending through the opening in between insert engaging area 1214 and support flap 1216. A portion 1244 of photovoltaic insert remains under support flap 1216. Photovoltaic insert 1202 may be sealed around the opening with respect to insert engaging area 1214 and support flap 1216. In certain embodiments, photovoltaic insert 1202 is configured to interlock with base portion, e.g., insert engaging area 1214 and/or support flap 1216. For example, interlocking features may be positioned on connector 1240. Connector 1240 is shown with two electrical sockets 1242*a* and 1242*b* for receiving conductive pins of the corresponding connector.

Returning to FIGS. 12A and 12B, in certain embodiments, the back side of insert engaging area 1214 includes a set of open channels, i.e., a first set of open channel 1230. In specific embodiments, these open channels are at least about 0.125 inches deep or, more specifically, at least about 0.25 inches deep or even at least about 0.5 inches deep. In the same or other embodiments, the front side of support flap area 1216 includes its own set of open channels, i.e., a second set of open channels 1232. Similarly, these channels may be at least about 0.125 inches deep or, more specifically, at least about 0.25 inches deep or even at least about 0.5 inches deep. First set of open channel 1230 is configured to coincide with a second set of open channels of a like adjacent module after installation. The front side of insert engaging area 1214 may also include a set of channels, i.e., a third set of open channels, for providing ventilation between this area and the insert. Finally, the back side of support flap 1216 may also include a set of channels, i.e., a fourth set of open channels, for providing ventilation between the support sheet and a building structure after installation.

Figure 14A:
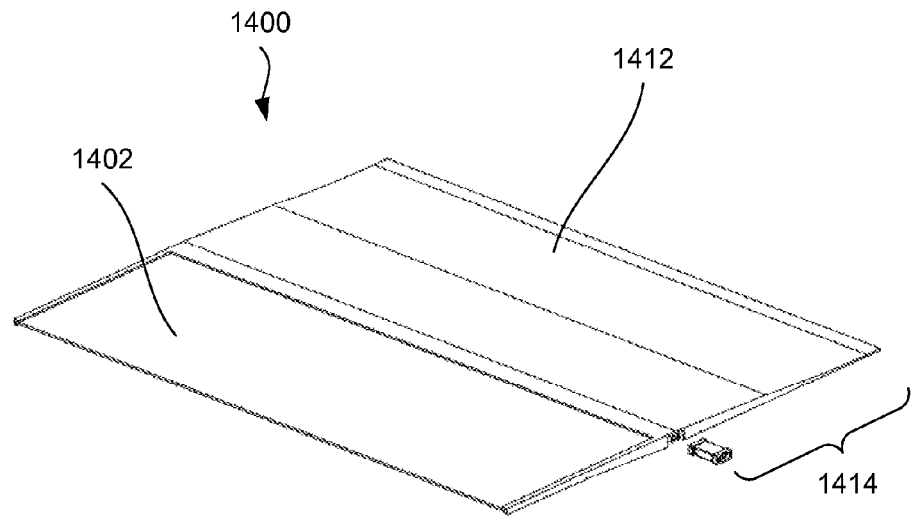
FIG. 14A is a schematic perspective view of an example of a BIP module having a photovoltaic insert secured to a base portion with integral stiffening ribs in accordance with certain embodiments.
Figure 14B:
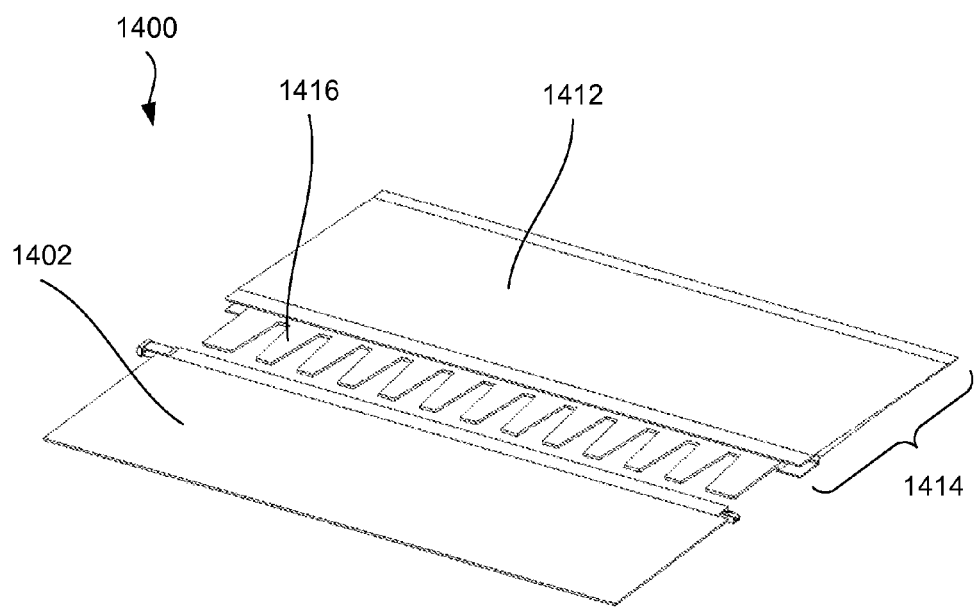
FIG. 14B is a schematic perspective view of the same BIP module as in FIG. 4A prior to attaching the photovoltaic insert to the base portion.

FIG. 14A is a schematic perspective view of another example of BIP module 1400. Similar to the previous examples, module 1400 also includes a photovoltaic insert 1402 having one or more photovoltaic cells positioned on a support sheet. Module 1400 also includes a base portion 1412 having a support flap 1414. FIG. 14B provides a more detailed illustration of various features by showing photovoltaic insert 1402 and base portion 1412 prior to attaching them to each other during assembly of module 1400. Specifically, base portion 1412 is shown with a set of edges 1416 extending away from support sheet 1414. Edges 1416 are configured to attach to insert 1402 for support. In certain embodiments, edges 1416 are extensions which are an integral part of support sheet 1414. These extensions may have a cross-profile formed like a "T", with a flat portion facing the back side of the photovoltaic insert. The flat portion has a stiffening rib underneath.

Edges 1416 may be glued and/or mechanically interlocked to the back side of insert 1402. In certain embodiments, edges 1416 are configured to form one or more removable mechanical connections with insert 1402 or, more specifically, with the support sheet of insert 1402. In certain embodiments, edges 1416 are removable with respect to support flap 1414 and represent one or more separate components. A specific example of the edges separable from the insert and base sheet is described above in the context of FIGS. 11A and 11B.

Figure 15A:
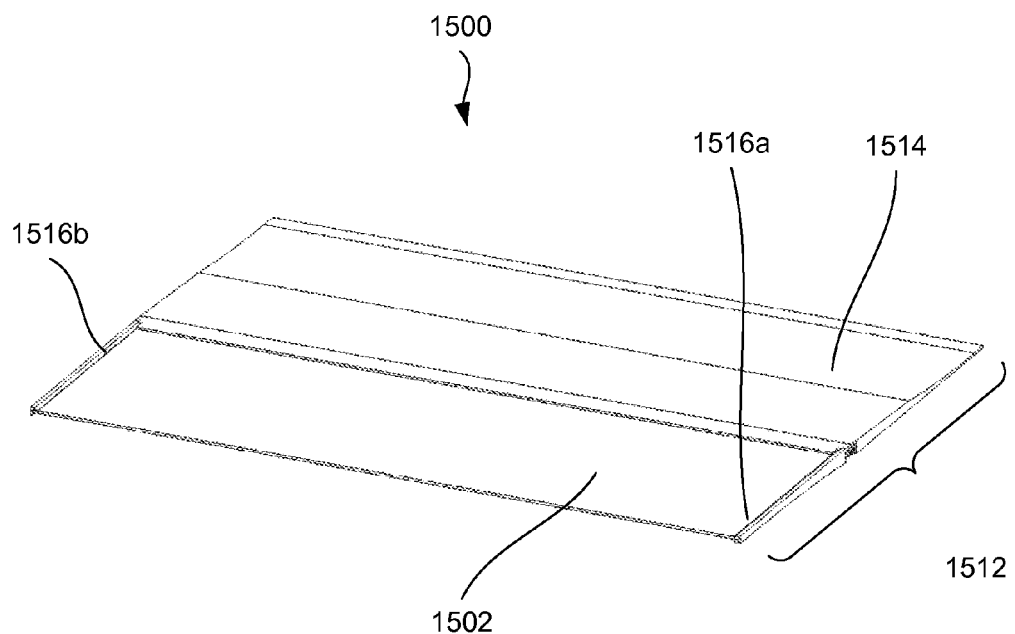
FIG. 15A is a schematic perspective view of another example of a BIP module having a photovoltaic insert secured to a base portion using two extension members in accordance with certain embodiments.
Figure 15B:
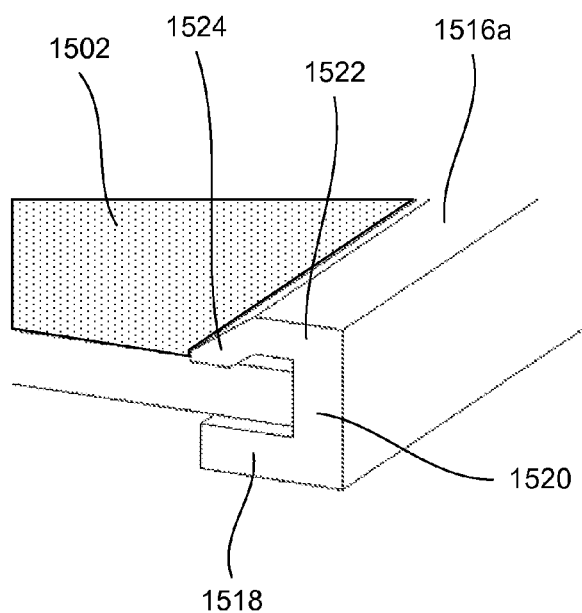
FIG. 15B is a schematic perspective view of the same BIP module as in FIG. 15A prior to attaching the photovoltaic insert to the base portion.

FIG. 15A is a schematic view of a BIP module 1500 in accordance with certain embodiments. Module 1500 includes a photovoltaic insert 1502 and a base portion 1512, which itself includes support flap 1514 and two extension members 1516*a* and 1516*b*. Two extension members 1516*a* and 1516*b* extend along two edges of insert 1502 and form mechanical connections to these edges during assembly of module 1500. These connections may be provided by the snug fit of the edges into the channels formed by two extension members 1516*a* and 1516*b* as shown in FIG. 15B. Specifically, FIG. 15B shows an expanded view of one corner of module 1500 illustrating an edge of insert 1502 snugly fit into the channel formed by extension member 1516*a*. Extension member 1516*a* has a "U-shaped" profile configured for receiving an edge of the insert. In certain embodiments, extension member 1516*a* is used for water draining. This profile is formed by a bottom portion 1518, a side portion 1520, a top portion 1522, and a lip 1524. Extension member 1516*a* may be made from rigid or semi-rigid materials such that at least bottom portion 1518 and lip 1524 exert some pressure on the edge of insert 1502 after installation to prevent this edge from sliding out of the channel. Some examples of rigid materials suitable for fabrication extension members 1516*a* and 1516*b* are listed above. During assembly of module 1500, an adhesive material and/or a sealant may be dispensed into this channel or on the edge of insert 1502 to provide better mechanical connection and/or seal.

Figure 16A:
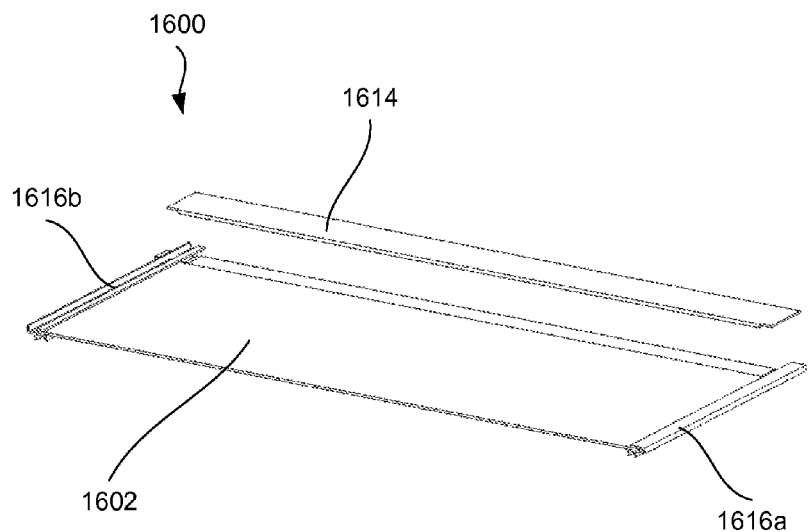
FIG. 16A is a schematic perspective view of an example of a BIP module having a photovoltaic insert secured to a base portion using two edge members removably attached to a support flap in accordance with certain embodiments.

FIG. 16A is a schematic view of a BIP module 1600 in accordance with certain embodiments. Module 1600 includes a photovoltaic insert 1602, a support flap 1614, and two edge members 1616*a* and 1616*b*. Support flap 1614 and edge members 1616*a* and 1616*b* may be separate components that are attached to insert 1602 during assembly of module 1600. Support flap 1614 and edge members 1616*a* and 1616*b* may have interlocking feature or otherwise snugly fir into each other to form these mechanical attachments. For connecting to photovoltaic insert 1602, two edge members 1616*a* and 1616*b* form two respective channels for receiving and snugly fitting edges of the insert. These channels may be similar to the ones described above with reference to FIG. 15B.

Figure 16B:
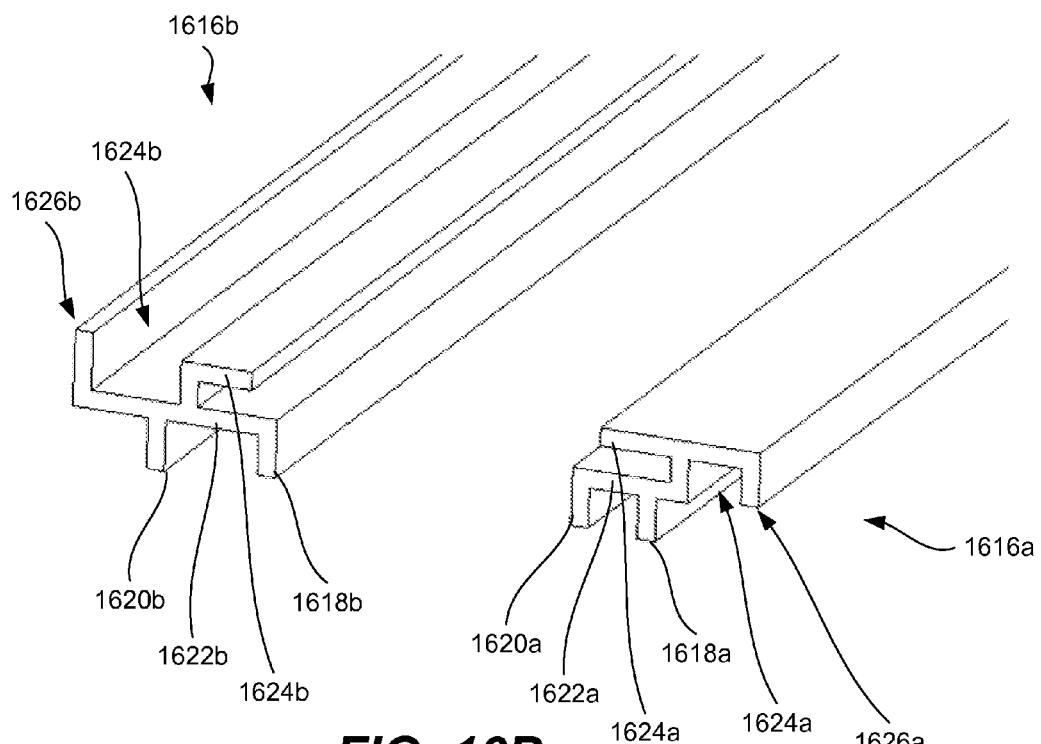
FIG. 16B is a schematic perspective view of the same BIP module as in FIG. 16A prior to attaching the photovoltaic insert to the base portion.

FIG. 16B is an expanded view of two edge members 1616*a* and 1616*b* illustrating some additional features. Edge member 1616*a* includes support ribs 1618*a* and 1620*a* for positioning on and, in certain embodiments, attaching to a building structure. These ribs may also function as ventilation similar as described above to form a ventilation channel between the back side of insert 1602 and the building structure. Edge member 1616*a* also includes a support surface 1622*a* and a top lip 1624*a* for engaging with an edge of insert 1602. Specifically, support surface 1622*a* and top lip 1624*a* may form a gap for snuggly fitting the edge and exerting the pressure onto the edge after assembly to prevent the edge from sliding out of this gap. An adhesive material and/or a sealant may be provided at this interface. Support surface 1622*a* contacts a portion of the back side surface of insert 1602 after assembly, while top lip 1624*a* contacts a portion of the front side of insert 1602. Top lip 1624*a* should be sufficiently large to provide adequate support to the edge of insert 1602 but not to block photovoltaic portion of the front side. A corresponding edge member 1616*b* has similar components that are aligned with respect to another edge of insert. Specifically, edge member 1616*b* includes support ribs 1618*b* and 1620*b* as well as support surface 1622*b* and a top lip 1624*b* that are designed and function similar to the corresponding elements of edge member 1616*a* described above.

Edge members 1616*a* and 1616*b* also include "L-shaped" channels, which could be respectively referred to as a top channel 1624*a* and a bottom channel 1624*b* based on orientation of their respective edges 1626*a* and 1626*b*. During installation of a photovoltaic array, an edge of a top channel of one module is inserted into a bottom channel of an adjacent module. This insertion also causes an edge of the bottom channel to be inserted into the top channel. This overlap forms a moisture barrier in between the two modules and, in certain embodiments, a side gutter similar to the one described in reference to FIG. 10.

Conclusion

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A building integrable photovoltaic module comprising:
a photovoltaic insert comprising a support sheet and one or more photovoltaic cells positioned on the support sheet; and
a base tray comprising a base sheet and two or more ventilation ribs protruding from the base sheet and towards the support sheet of the photovoltaic insert creating one or more ventilation channels, the one or more ventilation channels each having a length, the base tray extending a distance in the same direction as the lengths of the one or more ventilation channels, the distance being greater than the lengths of the one or more ventilation channels, the one or more ventilation channels each having at least a first height and a second height, the first height and the second height being different such that each of the one or more ventilation channels is tapered along its length from the first height to the second height, the base tray attached to the photovoltaic insert along at least one or more edges of the photovoltaic insert, the base tray configured for attachment to a building structure and configured to mechanically support the photovoltaic insert with respect to the building structure.

2. The building integrable photovoltaic module of claim 1, wherein the base tray comprises a support flap attached to the base sheet and configured to extend under a portion of an adjacent building integrable photovoltaic module.

3. The building integrable photovoltaic module of claim 2, wherein the photovoltaic insert is further attached to the base tray along an interface between the base sheet and the support flap.

4. The building integrable photovoltaic module of claim 1, further comprising one or more side channels, each side channel configured to interlock with a corresponding side channel of an adjacent building integrable photovoltaic module to form a side gutter after installation.

5. The building integrable photovoltaic module of claim 4, wherein the side gutter is configured to capture water leaking through a gap between the building integrable photovoltaic module and the adjacent building integrable photovoltaic modules and to deliver that water over a top surface of a bottom row of building integrable photovoltaic modules.

6. The building integrable photovoltaic module of claim 1, wherein the base tray is removably attached to the photovoltaic insert using a set of interlocking features disposed on the two or more ventilation ribs.

7. The building integrable photovoltaic module of claim 1, wherein the base tray is glued to the photovoltaic insert during fabrication of the building integrable photovoltaic module or during installation of the building integrable photovoltaic module on the building structure.

8. The building integrable photovoltaic module of claim 1, wherein the first height of the one or more ventilation channels is at least about 0.5 inches.

9. The building integrable photovoltaic module of claim 1, wherein the base tray comprising one or more of the following materials: polyethylene terephthalate, polybutylene terephthalate, nylon, polypropylene, polyphenylene sulfide, polyamide, polycarbonate, and polyvinyl chloride.

10. The building integrable photovoltaic module of claim 1, wherein the base tray comprises two or more additional ventilation ribs protruding from the base sheet and away from the support sheet of the photovoltaic insert.

11. The building integrable photovoltaic module of claim 1, wherein the second height of the one or more ventilation channels is 0 inches.

12. A building integrable photovoltaic module comprising:
a photovoltaic insert comprising one or more photovoltaic cells positioned on a support sheet; and
a base portion comprising a support flap, a rib structure attached to and protruding from the support flap, and one or more edges configured to form one or more removable mechanical connections with the support sheet of the photovoltaic insert, wherein:
when the base portion is mechanically connected to the support sheet of the photovoltaic insert by the one or more removable mechanical connections, the photovoltaic insert is mounted to the base portion such that the base portion fully mechanically supports the photovoltaic insert,
the rib structure is configured to attach and support the photovoltaic insert, and
the rib structure has a first height and a second height such that the first height and the second height are different and the rib structure tapers from the first height to the second height.

13. The building integrable photovoltaic module of claim 12, wherein the base portion comprises two extension members extending along two edges of the support sheet and forming mechanical connections with the support sheet.

14. The building integrable photovoltaic module of claim 13, wherein the two extension members comprise side gutters configured to interlock with one or more adjacent building integrable photovoltaic modules.

15. The building integrable photovoltaic module of claim 12, wherein the rib structure is attached to the photovoltaic insert using an adhesive.

16. The building integrable photovoltaic module of claim 12, wherein the base portion comprises one or more connector pockets for accommodating one or more connectors disposed on the photovoltaic insert.

17. The building integrable photovoltaic module of claim 12, wherein the one or more edges of the base portion comprises one or more channels for snugly fitting edges of the photovoltaic insert into the channels.

18. The building integrable photovoltaic module of claim 12, wherein the photovoltaic insert is sealed with respect to the base portion along a contact edge.

19. The building integrable photovoltaic module of claim 12, wherein the base portion comprising one or more of the following materials: polyethylene terephthalate, polybutylene terephthalate, nylon, polypropylene, polyphenylene sulfide, polyamide, polycarbonate, and polyvinyl chloride.

20. The building integrable photovoltaic module of claim 12, wherein the one or more edges are removable with respect to the base portion.

21. A building integrable photovoltaic module comprising:
a photovoltaic insert comprising a support sheet and one or more photovoltaic cells positioned on the support sheet; and
a base portion attached to the photovoltaic insert along at least one or more edges of the photovoltaic insert, configured for attachment to a building structure, and configured to mechanically support the photovoltaic insert with respect to the building structure, wherein the base portion includes:
    one or more ribs that protrude towards the support sheet to thereby form one or more channels between the base portion and the support sheet, the one or more channels each having a length, the base portion extending a distance in the same direction as the lengths of the one or more channels, the distance being greater than the lengths of the one or more channels, and
    a support flap and a support unit, the support unit including a cross-bar, a first rib structure, and a second rib structure, such that:
        the first and second rib structures attach to and extend away from the cross-bar, the first rib structure extends in a direction substantially opposite to the second rib structure; and
        the first rib structure is configured to support the support flap and the second rib structure is configured to support the photovoltaic insert.

22. A building integrable photovoltaic module comprising:
a photovoltaic insert comprising a support sheet and one or more photovoltaic cells positioned on the support sheet; and
a base portion configured for attachment to a building structure and configured to mechanically support the photovoltaic insert with respect to the building structure, wherein the base portion includes:
    one or more ribs that protrude towards the support sheet to thereby form one or more channels between the base portion and the support sheet, the one or more channels each having a length, the base portion extending a distance in the same direction as the lengths of the one or more channels, the distance being greater than the lengths of the one or more channels; and
    an insert engaging area and a support flap area each having a front side and a back side, such that:
        the insert engaging area supporting the photovoltaic insert is attached to the front side of the insert engaging area,
        the back side of the insert engaging area includes a first set of open channels, and
        the front side of the support flap area includes a second set of open channels such that the first set of open channel is configured to coincide with the second set of open channels of another adjacent building integrable photovoltaic module after installation.

* * * * *